(12) United States Patent
Natsume

(10) Patent No.: US 6,900,513 B2
(45) Date of Patent: May 31, 2005

(54) SEMICONDUCTOR MEMORY DEVICE AND MANUFACTURING METHOD THEREOF

(75) Inventor: Hidetaka Natsume, Tokyo (JP)

(73) Assignee: NEC Electronics Corporation, Kawasaki (JP)

( * ) Notice: Subject to any disclaimer, the term of this patent is extended or adjusted under 35 U.S.C. 154(b) by 0 days.

(21) Appl. No.: 10/046,792

(22) Filed: Jan. 15, 2002

(65) Prior Publication Data

US 2002/0096734 A1 Jul. 25, 2002

(30) Foreign Application Priority Data

Jan. 22, 2001 (JP) ........................................ 2001-013330

(51) Int. Cl.[7] ........................ H01L 27/108; H01L 29/74
(52) U.S. Cl. ........................ 257/508; 257/296; 257/300; 257/393; 365/63; 365/154; 365/156; 365/205; 365/207
(58) Field of Search ................................. 257/508, 296, 257/300, 393, 369, 390, 295, 388; 365/63, 154, 156, 205, 207

(56) References Cited

U.S. PATENT DOCUMENTS

| 5,705,838 | A | * | 1/1998 | Jost et al. .................... 257/296 |
| 5,780,910 | A | * | 7/1998 | Hashimoto et al. .......... 257/393 |
| 5,859,451 | A | * | 1/1999 | Narita ......................... 257/306 |
| 6,091,628 | A | | 7/2000 | Kim |
| 6,373,089 | B1 | * | 4/2002 | Shrivastava et al. ........ 257/306 |

FOREIGN PATENT DOCUMENTS

| EP | 0 104 616 | 4/1984 |
| JP | 07-099255 | 4/1995 |
| JP | 09-260510 | 10/1997 |
| JP | 10-163440 | * 6/1998 |
| JP | 11-145288 | 5/1999 |
| JP | 11-251457 | 9/1999 |
| JP | 2001-332633 | 11/2001 |
| KR | 1999-029622 | 4/1999 |

OTHER PUBLICATIONS

Inohara et al. Highly Scalable and Fully Logic Compatible SRAM Cell Technology with Metal Damascene Process and W Local Interconnect. Symposium on VLSI Technology Digest of Technical Papers pp. 64–65, 1998.

Ootsuka et al. A Novel .20 μm Full CMOS SRAM Cell Using Stacked Cross Couple with Enhanced Soft Error Immunity. IEDM 1998.

Japanese Office Action dated Sep. 15, 2004.

* cited by examiner

*Primary Examiner*—Allan R. Wilson
*Assistant Examiner*—Joseph Nguyen
(74) *Attorney, Agent, or Firm*—Katten Muchin Zavis Rosenman

(57) ABSTRACT

The present invention relates to a semiconductor memory device having a SRAM in which a memory cell comprises a pair of transmission transistors and a flip-flop circuit containing a pair of driver transistors and a pair of load transistors, wherein: a first conductive film interconnection formed from a first conductive film which is set on a semiconductor substrate, constitutes respective gate electrodes of said driver transistors, load transistors and transmission transistors; an inlaid interconnection set in a first insulating film lying on said semiconductor substrate, constitutes one of a pair of local interconnections cross-coupling a pair of input/output terminals in said flip-flop circuit; and a second conductive film interconnection formed from a second conductive film which is set on a second insulating film lying on said first insulating film, constitutes the other one of said pair of local interconnections.

16 Claims, 38 Drawing Sheets

SEMICONDUCTOR MEMORY DEVICE AND MANUFACTURING METHOD THEREOF

TECHNICAL FIELD

The present invention relates to a semiconductor memory device and a manufacturing method thereof and more particularly to a semiconductor memory device having a SRAM (Static Random Access Memory) and a manufacturing method thereof.

BACKGROUND OF THE INVENTION

With reference to a drawing, the basic structure of a SRAM memory cell that is a semiconductor memory element is described below.

As shown in a circuit diagram of FIG. 22, a SRAM memory cell is composed of a flip-flop circuit that functions as an information storage section and a pair of transmission transistors $T_1$ and $T_2$ that control the conduction between data lines (bit lines, $BL_1$ and $BL_2$) which serve for writing and reading of the information and the flip-flop circuit. The flip-flop circuit is made of, for example, a pair of CMOS (Complementary Metal Oxide Semiconductor) inverters and each CMOS inverter contains a driver transistor $D_1$ ($D_2$) and a load transistor $P_1$ ($P_2$).

One side of source/drain regions in each transmission transistor $T_1$ ($T_2$) is connected to drains of a load transistor $P_1$ ($P_2$) as well as a driver transistor $D_1$ ($D_2$), and the other side thereof is connected to a bit line $BL_1$ ($BL_2$). Further, gates of a pair of the transmission transistors $T_1$ and $T_2$ each form a part of a word line WL and are connected with each other.

The gates of the driver transistor $D_1$ and the load transistor $P_1$ which constitute one of the CMOS inverters are connected to the drains (the storage node $N_2$) of a driver transistor $D_2$ and a load transistor $P_2$ which constitute the other of the CMOS inverters. Further, the gates of the driver transistor $D_2$ and the load transistor $P_2$ which constitute the latter of the CMOS inverters are connected to the drains (the storage node $N_1$) of the driver transistor $D_1$ and the load transistor $P_1$ which constitute the former of the CMOS inverters. In effect, a pair of CMOS inverters are arranged such that the input/output section of each CMOS inverters may be cross-coupled with the gate of the other CMOS inverter through one of a pair of interconnections $L_1$ and $L_2$, which are called the local interconnections.

Further, a reference voltage ($V_{ss}$, for example, GND) is applied to the source region of each one of the driver transistors $D_1$ and $D_2$, and a supply voltage ($V_{cc}$) is applied to the source region of each one of the load transistors $P_1$ and $P_2$.

The SRAM cell described above has excellent element characteristics such as the high noise tolerance and the small stand-by power. Further, for the SRAM cell of this sort, in view of element characteristics, selection of the materials and layout are carefully made so as not to lose symmetry of the element structure (in other words, to prevent imbalance from occurring) within the limits of possibility,.

However, the SRAM cell described above has a problem that a cell area tends to become considerably large, due to requirements to have 6 transistors in one memory cell and isolate p-type MOSs from n-type MOSs within one and the same cell as well as the need of numerous interconnections. Another disadvantage it has is the large number of the steps in the manufacturing method thereof.

Therefore, with respect of the structure of the 6-transistors type SRAM cell and manufacturing method thereof, various propositions have been made so far.

For example, in Symp. on VLSI Tech., p. 64 (1998) by M. Inohara et al., a method of forming each one of a pair of local interconnections through the metal damascene process is disclosed. In this method, two tungsten (W) local interconnections which are damascene interconnections are formed in different layers, respectively, and thereby formation of a cross-couple is achieved. It is, therein, described that, because a tungsten plug reaching an active region on a substrate and one (a lower layer) of the local interconnections are formed by making their openings simultaneously, this SRAM memory cell can be fabricated without setting additional photomasks or increasing the number of the steps in fabrication. Nevertheless, in this method, because the other one (an upper layer) of the local interconnections should be formed in such a way that its disposition could avoid any contact with the lower layer of the local interconnections, a reduction in cell size attained cannot be sufficiently large.

Further, in Japanese Patent Application Laid-open No. 251457/1999, it is described that, in fabrication of a 6-transistors type cell, a pair of local interconnections are both formed with a metal damascene process, and besides disposed on one and the same layer. Yet, in this method, too, it is difficult to achieve a sufficient reduction in cell size, since a pair of local interconnections must be disposed so as not to come into contact with each other.

Meanwhile, in Japanese Patent Application Laid-open No. 260510/1997, with the object of reducing in size of the memory cell and improving the α-ray soft error resistance, there is disclosed an element structure described below. A similar structure is also described by F. Ootsuka et al. in IEDM, p. 205 (1998).

In this structure, a pair of local interconnections to form a cross couple are formed by applying etching to different conductive layers, respectively. An upper layer of local interconnections is disposed so as to overlap a lower layer of local interconnections, and these local interconnections separated by an insulating film (a capacity insulating film) constitute a capacitor element.

However, for such an element structure, a contact hole must be formed separately for each one of a pair of local interconnections so that a substantially large number of steps are required in its fabrication. Further, in this structure, the local interconnections are laid in a relatively wide range, extending even as far as the top of a gate electrode, with a thin insulating film lying therebetween. When a conductive film pattern is to be formed on such an uneven substrate surface, there arises a problem that superfluous parts of the conductive film may remain at unrequired positions because, in performing patterning of the conductive film by means of anisotropic etching, it is difficult to remove portions of the conductive film around stepped parts. Further, when a capacitor insulating film is to be formed on such an uneven surface, the film thickness thereof tends to increase around the stepped parts. On the other hand, if the film thickness around the stepped parts is to be made satisfactorily thin, there may arise another problem that the film thickness in the flat region becomes excessively thin, which may result in damage to insulation thereof. In short, formation of a thin and, at the same time, even capacitor insulating film is difficult to achieve.

In view of the above discussion, it would be desirable to provide a technology capable to reduce easily the memory cell size of the SRAM without unduly increasing the number of the steps in the manufacturing method thereof. It would also be desirable to provide a technology to improve the α-ray soft error resistance of the SRAM.

SUMMARY OF THE INVENTION

The present invention can provide a SRAM whose memory cell size is readily reduced without unduly increasing the number of the steps in the manufacturing method thereof. Further, the present invention can improve the α-ray soft error resistance of the SRAM.

The present invention relates to a semiconductor memory device having a SRAM in which a memory cell comprises a pair of transmission transistors and a flip-flop circuit containing a pair of driver transistors and a pair of load transistors, wherein:

a first interconnection formed from a first electrical conductor which is set on a semiconductor substrate, constitute respective gate electrodes of said driver transistors, load transistors and transmission transistors;

a second interconnection including a second electrical conductor which is formed within a trench that is set in a first insulating film lying on said semiconductor substrate, constitutes one of a pair of local interconnections cross-coupling a pair of input/output terminals in said flip-flop circuit;

a third interconnection which is formed on a second insulating film lying on a region including the top surface of said second interconnection, constitutes the other one of said pair of local interconnections; and either said second interconnection or said third interconnection has a buried conductive section which is formed to fill up the inside of said trench.

Further, the present invention relates to the semiconductor memory device as set forth above, wherein:

said second interconnection and said third interconnection have an overlapping section separated by said second insulating film, and said second interconnection and said third interconnection, together with said second insulating film lying therebetween, constitute a capacitor element.

Further, the present invention relates to the semiconductor memory device as set forth above, wherein:

said second electrical conductor is disposed so as to come in contact with a drain region constituting a first driver transistor which is one of said pair of driver transistors;

a drain region constituting a first load transistor which is one of said pair of load transistors and has a gate electrode formed from a first interconnection A, the gate electrode being in common to said first driver transistor, and a first interconnection B which constitutes a gate electrode of a second driver transistor which is the other one of the pair of driver transistors as well as a gate electrode of a second load transistor which is the other one of the pair of load transistors; and said third interconnection is in contact with a contact section connected to said first interconnection A;

a contact section connected to a drain region of said second driver transistor; and a contact section connected to a drain region of said load transistor.

Further, the present invention relates to a semiconductor memory device having a SRAM in which a memory cell comprises a pair of transmission transistors and a flip-flop circuit containing a pair of driver transistors and a pair of load transistors, wherein:

a first conductive film interconnection formed from a first conductive film which is set on a semiconductor substrate, constitutes respective gate electrodes of said driver transistors, load transistors and transmission transistors;

an inlaid interconnection set in a first insulating film lying on said semiconductor substrate, constitutes one of a pair of local interconnections cross-coupling a pair of input/output terminals in said flip-flop circuit; and a second conductive film interconnection formed from a second conductive film which is set on a second insulating film lying on said first insulating film, constitutes the other one of said pair of local interconnections.

Further, the present invention relates to the semiconductor memory device as set forth above, wherein said second conductive film interconnection is disposed so as to overlap at least a portion of a top surface of said inlaid interconnection, with said second insulating film lying therebetween; and said inlaid interconnection and said second conductive film interconnection, together with said second insulating film lying therebetween, constitute a capacitor element.

Further, the present invention relates to the semiconductor memory device as set forth above; wherein said second conductive film interconnection is disposed so as to cover at least a portion of a lateral face of said inlaid interconnection, with said second insulating film placed therebetween; and said inlaid interconnection and said second conductive film interconnection, together with said second insulating film lying therebetween, constitute a capacitor element.

Further, the present invention relates to the semiconductor memory device as set for the above, wherein:

said inlaid interconnection is disposed so as to come in contact with a drain region constituting a first driver transistor which is one of said pair of driver transistors;

a drain region constituting a first load transistor which is one of said pair of load transistors and has a gate electrode formed from a first conductive film interconnection A, the gate electrode being in common to said first driver transistor; and a first conductive film interconnection B which constitutes a gate electrode of a second driver transistor which is the other one of the pair of driver transistors as well as a gate electrode of a second load transistor which is the other one of the pair of load transistors; and said second conductive film interconnection is in contact with a contact section to reach said first conductive film interconnection A;

a contact section to reach a drain region of said second driver transistor; and a contact section to reach a drain region of said second load transistor.

Further, the present invention relates to the semiconductor memory device as set forth above, wherein said first conductive film interconnection B branches off between the drain region of said second driver transistor and the drain region of said second load transistor, and this branched section of interconnection comes into contact with said inlaid interconnection.

Further, the present invention relates to the semiconductor memory device as set forth above, wherein a contact region between said branched section of interconnection and said inlaid interconnection contains a point that is, seen from the substrate top surface, equidistant from any among a group of said contact section to reach the first conductive film interconnection A, said contact section to reach the drain region of the second driver transistor and said contact section to reach the drain region of the second load transistor.

Further, the present invention relates to a semiconductor memory device having a SRAM in which a memory cell comprises a pair of transmission transistors and a flip-flop circuit containing a pair of driver transistors and a pair of load transistors, wherein:

a first conductive film interconnection formed from a first conductive film which is set on a semiconductor substrate, constitutes respective gate electrodes of said driver transistors, load transistors and transmission transistors;

an inlaid interconnection which is set in a first insulating film lying on said semiconductor substrate and a stacked electrode which is set on said inlaid interconnection constitutes one of a pair of local interconnections cross-coupling a pair of input/output terminals in said flip-flop circuit;

a second conductive film interconnection formed from a second conductive film which is formed on a second insulating film lying on said first insulating film, constitutes the other one of said pair of local interconnections; and said second conductive film interconnection is disposed so as to overlap, at least, a portion of a top surface and a portion of a lateral face of said stacked electrode with said second insulating film placed therebetween, and said stacked electrode and said second conductive film interconnection, together with said second insulating film lying therebetween, constitute a capacitor element.

Further, the present invention relates to a semiconductor memory device having a SRAM in which a memory cell comprises a pair of transmission transistors and a flip-flop circuit containing a pair of driver transistors and a pair of load transistors, wherein:

a first conductive film interconnection formed from a first conductive film which is set on a semiconductor substrate, constitutes respective gate electrodes of said driver transistors, load transistors and transmission transistors;

an inlaid interconnection set in a first insulating film lying on said semiconductor substrate, constitutes one of a pair of local interconnections cross-coupling a pair of input/output terminals in said flip-flop circuit;

within a trench that is formed in a third insulating film lying on said first insulating film, there is provided with an in-trench electrode film, which comes in contact with said inlaid interconnection at the bottom of the trench;

a second conductive film which is set on a second insulating film lying on said third insulating film, and a buried electrode which is formed by filling up said trench, with said in-trench electrode film as well as said second insulating film being placed therebetween, constitute the other one of said pair of local interconnections; and said buried electrode and said in-trench electrode film, together with said second insulating film lying therebetween, constitute a capacitor element.

Further, the present invention relates to a semiconductor memory device having a SRAM in which a memory cell comprises a pair of transmission transistors and a flip-flop circuit containing a pair of driver transistors and a pair of load transistors, wherein:

a first conductive film interconnection formed from a first conductive film which is set on a semiconductor substrate, constitutes respective gate electrodes of said driver transistors, load transistors and transmission transistors;

within a trench that is formed in a first insulating film lying on said semiconductor substrate, there is provided with an in-trench conductive film, which constitutes one of a pair of local interconnections cross-coupling a pair of input/output terminals in said flip-flop circuit;

a second conductive film which is set on a second insulating film lying on said first insulating film, and a buried electrode which is formed by filling up said trench, with said in-trench electrode film as well as said second insulating film being placed therebetween, constitute the other one of said pair of local interconnections; and said buried electrode and said in-trench electrode film, together with said second insulating film lying therebetween, constitute a capacitor element.

Further, the present invention relates to the semiconductor memory device as set forth above, wherein a refractory metal silicide layer is formed on the surface of every gate electrodes, source regions and drain regions of said pair of driver transistors, said pair of load transistors and said pair of transmission transistors.

Further, the present invention relates to a method of manufacturing a semiconductor memory device having a SRAM in which a memory cell comprises a pair of transmission transistors and a flip-flop circuit containing a pair of driver transistors and a pair of load transistors, which comprises the steps of:

forming, on a semiconductor substrate, active regions to form respective source regions and drain regions of said driver transistors, said load transistors and said transmission transistors;

forming, on said semiconductor substrate, a first conductive film; and thereafter patterning this first conductive film to form a first conductive film interconnection that is to serve as an interconnection to constitutes respective gate electrodes of said driver transistors, said load transistors and said transmission transistors;

forming, on said semiconductor substrate, a first insulating film; and thereafter forming, in this first insulating film, an inlaid interconnection as one of a pair of local interconnections cross-coupling a pair of input/output terminals in said flip-flop circuit; and forming, on said first insulating film, a second insulating film, and thereafter forming a second conductive film and, then, patterning this second conductive film to form a second conductive film interconnection as the other one of said pair of local interconnections.

Further, the present invention relates to the method of manufacturing a semiconductor memory device as set forth above; wherein said second conductive film interconnection is disposed so as to overlap at least a portion of a top surface of said inlaid interconnection, with said second insulating film lying therebetween; and said inlaid interconnection and said second conductive film interconnection, together with said second insulating film lying therebetween, constitute a capacitor element.

Further, the present invention relates to a method of manufacturing a semiconductor memory device having a SRAM in which a memory cell comprises a pair of transmission transistors and a flip-flop circuit containing a pair of driver transistors and a pair of load transistors, which comprises the steps of:

forming, on a semiconductor substrate, active regions to form respective source regions and drain regions of said driver transistors, said load transistors and said transmission transistors;

forming, on said semiconductor substrate, a first conductive film; and thereafter patterning this first conductive film to form a first conductive film interconnection that is to serve as an interconnection to constitute respective gate electrodes of said driver transistors, said load transistors and said transmission transistors;

forming, on said semiconductor substrate, a first insulating film, and thereafter forming, in this first insulating film, an inlaid interconnection as one of a pair of local interconnections cross-coupling a pair of input/output terminals in said flip-flop circuit;

exposing a part of a lateral face of said inlaid interconnection; and forming a second insulating film on said first insulating film and the exposed section of said inlaid interconnection; and thereafter forming a second conductive film and, then, patterning this second conductive film so as to overlap the top surface and a portion of the lateral face of said inlaid interconnection, with said second insulating film placed therebetween; and thereby forming a second conductive film interconnection which constitutes the other one of said pair of local interconnections, which provides a capacitor element composed of said second conductive film interconnection and the top surface and a portion of the lateral face of said inlaid interconnection, together with said second insulating film lying therebetween.

Further, the present invention relates to the method of manufacturing a semiconductor memory device as set forth above, wherein:

said inlaid interconnection is formed so as to come in contact with a drain region constituting a first driver transistor which is one of said pair of driver transistors;

a drain region constituting a first load transistor which is one of said pair of load transistors and has a gate electrode formed from a first conductive film interconnection A, the gate electrode being in common to said first driver transistor, and a first conductive film interconnection B which constitutes a gate electrode of a second driver transistor which is the other one of the pair of driver transistors as well as a gate electrode of a second load transistor which is the other one of the pair of load transistors; and said second conductive film interconnection is formed to come into contact with every one of contact sections which are made by forming, concurrently, a contact hole to reach said first conductive film interconnection A, a contact hole to reach the drain region of said second driver transistor, and a contact hole to reach the drain region of said second load transistor; and thereafter filling up these contact holes with a conductive material.

Further, the present invention relates to the method of manufacturing a semiconductor memory device as set forth above, wherein said first conductive film interconnection B is formed into the branched shape in which branching off takes place between the drain region of said second driver transistor and the drain region of said second load transistor, and said inlaid interconnection is formed so as to come into contact with this branched section of interconnection.

Further, the present invention relates to the method of manufacturing a semiconductor memory device as set forth above, which further comprises the step of forming a refractory metal silicide layer on the surface of every source regions and drain regions of said pair of driver transistors, said pair of load transistors and said pair of transmission transistors as well as on the surface of said first conductive film interconnection which constitutes gate electrodes thereof.

In the present invention, by forming a pair of local interconnections from different conductive layers, it becomes possible to dispose these two local interconnections partially overlapped with each other so that the occupied area of the memory cell can be well reduced.

Further, in the present invention, because a pair of the local interconnections separated by an insulating film can constitute a capacitor element, α-ray soft error resistance can be prevented from lowering, which may take place along with miniaturization of the memory cell size or a decrease in operation voltage.

Further, in the present invention, when one of the local interconnections set in a lower layer is made of an inlaid interconnection, formation of this lower layer local interconnection can be made, together with formation of a contact plug so that fabrication thereof can be achieved with the small number of steps. Further, when one of the local interconnections set in a lower layer is made of an inlaid interconnection, due to improved planarity, it becomes possible, with ease, to form thinly as well as uniformly a capacitor insulating film and the other one of local interconnections which are set in an upper layer, which may improve the yield and element characteristics.

Further, in the present invention, through formation of a refractory metal silicide layer that is a low-resistance material on source/drain regions or gate electrodes, a still higher speed operation can be attained without relying upon a symmetry of the SRAM structure.

DETAILED DESCRIPTION OF THE EMBODIMENTS

Preferred embodiments of the present invention are described below.

Figure 1:
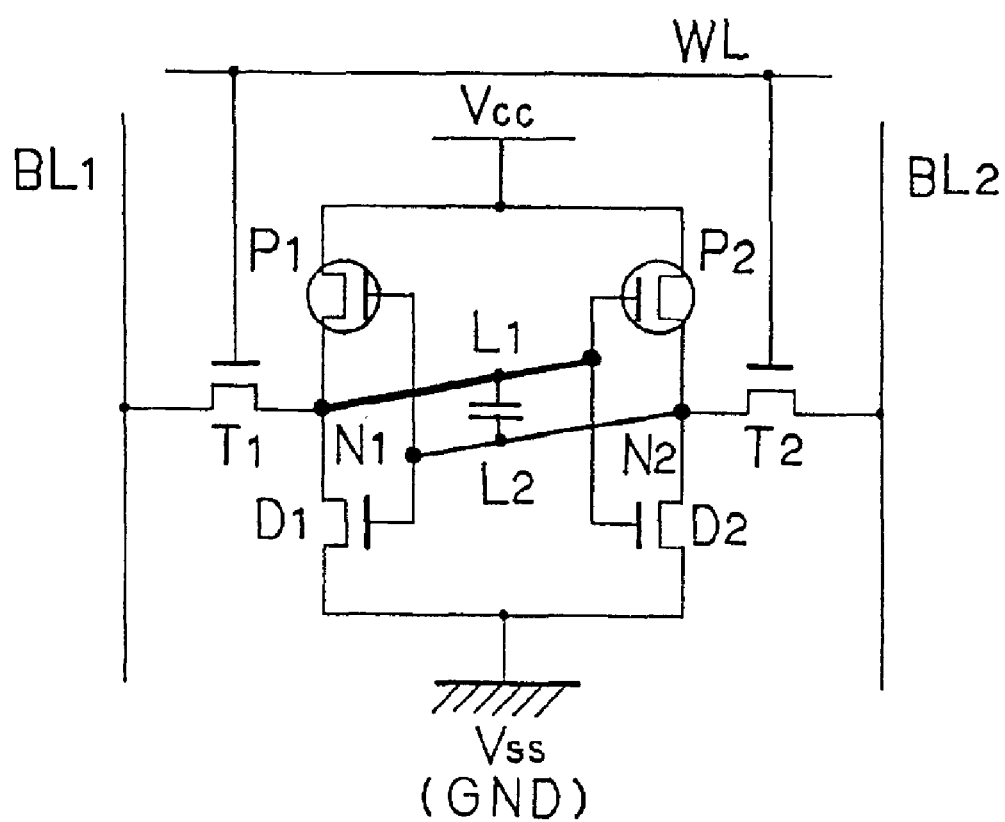
FIG. 1 is a circuit diagram of a SRAM memory cell in a semiconductor memory device according to the present invention.

As shown in FIG. 1, a memory cell in a SRAM of the present invention, composed of a pair of driver transistors $D_1$ and $D_2$, a pair of load transistors $P_1$ and $P_2$, and a pair of transmission transistors $T_1$ and $T_2$, is disposed in an intersection region of a word line WL and a pair of bit lines $BL_1$ and $BL_2$. A pair of driver transistors $D_1$ and $D_2$ as well as a pair of transmission transistors $T_1$ and $T_2$ consist of n-channel type ones, while a pair of load transistors $P_1$ and $P_2$ consist of p-channel type ones.

A pair of driver transistors $D_1$ and $D_2$ and a pair of load transistors $P_1$ and $P_2$ make up a flip-flop circuit that functions as an information storage section for memorizing 1 bit information. This flip-flop circuit is composed of a pair of CMOS inverters, and each CMOS inverter contains a driver transistor $D_1$ ($D_2$) and a load transistor $P_1$ ($P_2$).

One side of source/drain regions in each transmission transistor $T_1$ ($T_2$) is connected to drains of the load transistor $P_1$ ($P_2$) as well as the driver transistor $D_1$ ($D_2$), and the other side thereof is connected to a bit line $BL_1$ ($BL_2$). Further, gates of a pair of transmission transistors $T_1$ and $T_2$ each form a part of a word line WL and are connected with each other.

The gates of the driver transistor $D_1$ and the load transistor $P_1$ which constitute one of the CMOS inverters are connected to the drains (the storage node $N_2$) of the driver transistor $D_2$ and the load transistor $P_2$ which constitute the other of the CMOS inverters. Further, the gates of the driver transistor $D_2$ and the load transistor $P_2$ which constitute the latter of the CMOS inverters are connected to the drains (the storage node $N_1$) of the driver transistor $D_1$ and the load transistor $P_1$ which constitute the former of the CMOS inverters. In effect, a pair of CMOS inverters are arranged such that the input/output section of each CMOS inverters may be cross-coupled with the gate of the other CMOS inverter through one of a pair of interconnections $L_1$ and $L_2$, which are called the local interconnections.

Further, a reference voltage ($V_{ss}$, for example, GND) is applied to the source region of each one of the driver transistors $D_1$ and $D_2$, and a supply voltage ($V_{cc}$) is allied to the source region of each one of the load transistors $P_1$ and $P_2$.

First and Second Embodiments

Next, First and Second Embodiments of the present invention are described below.

In the First Embodiment, a pair of local interconnections $L_1$ and $L_2$ are disposed in two different layers, with the local interconnection in a lower layer being formed of an inlaid (damascene) interconnection and the local interconnection in an upper layer, formed of a conductive film in the form of a plate. Further, the disposition of these local interconnection is arranged in such a way that, seen from the top surface (the top surface plane) of the substrate, a portion of the upper layer local interconnection (the plate-shaped interconnection) overlaps at least a portion of the top surface of the lower layer local interconnection (the inlaid interconnection), with an insulating film lying therebetween. Herein, the lower layer local interconnection (the inlaid interconnection) and the upper layer local interconnection (the plate-shaped interconnection), separated by an insulating film, constitute a capacitor element.

Since the inlaid interconnection has a considerable thickness (a length in the direction of the depth) and the plate-shaped interconnection of a conductive film has a large top surface area, both interconnections can achieve a good reduction in interconnection resistance, compared with interconnections made of a conductive thin film in the form of a minute line.

Referring to the drawings, the structure of the above SRAM memory cell is described specifically in detail below.

Figure 2:
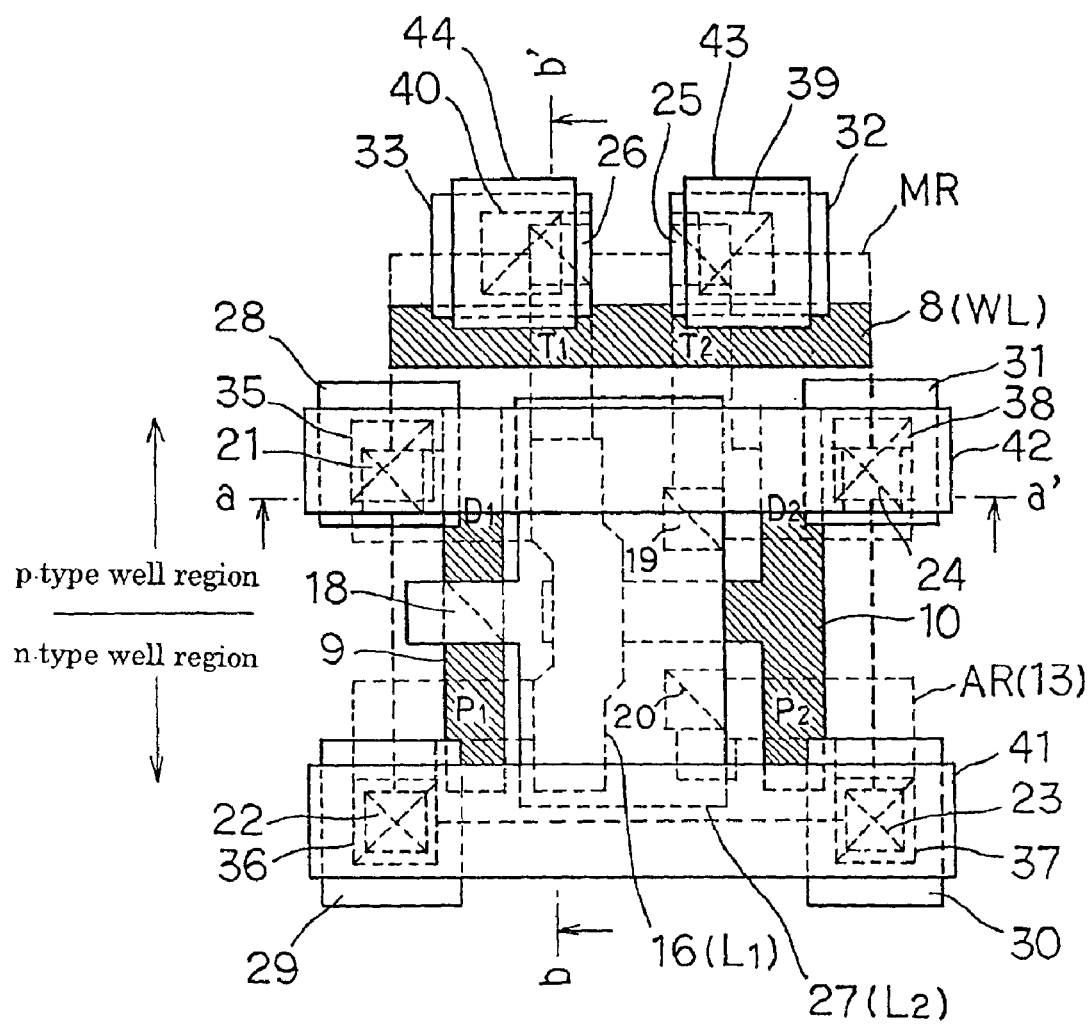
FIG. 2 is a plan view in explaining an embodiment of a SRAM memory cell in a semiconductor memory device according to the present invention.

FIG. 2 is a plan view of a memory cell, and FIG. 3(a) and (b) are cross-sectional views taken along the line a–a' and the line b–b' of FIG. 2, respectively. Any insulating film, bit line, and plug to connect to the bit line are, herein, omitted from the plan view.

6 transistors comprised in the memory cell are formed in active regions ARs each surrounded by element isolation regions 5 on a semiconductor substrate made of a single crystal silicon. N-channel type driver transistors $D_1$ and $D_2$ as well as transmission transistors $T_1$ and $T_2$ are formed in a p-type well region, while p-channel type load transistors $P_1$ and $P_2$, in an n-type well region.

A pair of transmission transistors $T_1$ and $T_2$ are each composed of n-type source/drain regions 13a formed in the active region of p-type well, a gate oxide film 7 formed on the surface of this active region, and a gate electrode 8 formed on this gate oxide film 7. This gate electrode 8 has, for example, a layered structure made of a doped polycrystalline silicone film and a refractory metal silicide film (a tungsten silicide film, a cobalt silicide film, a titanium silicide film or the like), and is formed with a word line WL as one body. The word line WL is set running in a first direction (the left-right direction in FIG. 2) and, along this first direction, a pair of transmission transistors are disposed, adjacent to each other. Further, the deposition of the pair of transmission transistors is arranged in such a way that the direction of the gate length thereof coincides with a second direction (the top-bottom direction in FIG. 2), perpendicular to the first direction.

A pair of driver transistors $D_1$ and $D_2$ are each composed of n-type source/drain regions 13a formed in the active region of p-type well, a gate oxide film 7 formed on the surface of this active region, and a gate electrode 9 or 10 formed on this gate oxide film 7. This gate electrode 9 or 10 has, for example, a layered structure made of a doped polycrystalline silicone film and a refractory metal silicide film (a tungsten silicide film, a cobalt silicide film, a titanium silicide film or the like). The drain region of the driver transistor $D_1$ is formed in the active region in common with one of the source/drain regions of the transmission transistor $T_1$, while the drain region of the driver transistor $D_2$ is formed in the active region in common with one of the source/drain regions of the transmission transistor $T_2$.

A pair of load transistors $P_1$ and $P_2$ are each composed of p-type source/drain regions 13b formed in the active region of n-type well, a gate oxide film 7 formed on the surface of this active region, and a gate electrode 9 or 10 formed on this gate oxide film 7. The gate electrode 9 of the load transistor $P_1$ is formed with the gate electrode of the driver transistor $D_1$ as one body, while the gate electrode 10 of the load transistor $P_2$ is formed with the gate electrode of the driver transistor $D_2$ as one body.

The driver transistor $D_1$ is disposed between the transmission transistor $T_1$ and the load transistor $P_1$ in the afore-mentioned second direction. The driver transistor $D_2$ is disposed between the transmission transistor $T_2$ and the load transistor $P_2$ in the afore-mentioned second direction. The disposition of a pair of driver transistors and a pair of load transistors are arranged in such a way that the direction of any gate length thereof coincides with the afore-mentioned first direction.

It is preferable to set a refractory metal silicide layer (not shown in the drawings) such as s titanium silicide layer or a cobalt silicide layer on the surface of every source/drain regions of a pair of driver transistors, a pair of load transistors and a pair of transmission transistors, for the purpose of reducing the sheet resistance and the contact resistance caused by the contact plug.

On the lateral face of every gate electrode that is contained in a pair of driver transistors, a pair of load transistors and a pair of transmission transistors, there is formed a sidewall 12. Further, on the top of the gate electrode, there may be set a cap layer (not shown in the drawings) made of a silicon oxide film or the like.

On the top of any one of six transistors, a silicon nitride film 14 is formed, and, on the top of this silicon nitride film 14, a first interlayer insulating film 15 is formed to a thickness of 300–1000 nm or so from PSG (Phospho-Silicate Glass), BPSG (Boron Phosphorous Silicate Glass) or such.

Within this first interlayer insulating film 15, there is formed an inlaid interconnection 16 ($L_1$) that is one of a pair of local interconnections. To form this inlaid interconnection 16 ($L_1$), a trench is formed in the first interlayer insulating film 15 and filled up with a conductive metal such as tungsten. While one end section of this inlaid interconnection 16 ($L_1$) is electrically connected to the drain region of the driver transistor $D_1$, the other end section thereof is electrically connected to the drain region of the load transistor $P_1$. Further, the central section of the inlaid interconnection 16 ($L_1$) is electrically connected to the gate electrode 10, which serves for both of the driver transistor $D_2$ and the load transistor $P_2$. This gate electrode 10 branches off between the drain region of the driver transistor $D_2$ and the drain region of the load transistor $P_2$ towards the direction of transistors $D_1$ and $P_1$, and this branched section comes into contact with the central section of the inlaid interconnection 16. This contact section is preferably disposed at a position, seen from the top, substantially equidistant from any of three contact plugs 18, 19 and 20 described below. In this instance, although the inlaid interconnection can be zonal and besides, seen from the top, rectangular in shape, it may take the shape of a zone deflected in the central section, being drawn aside towards the side of transistors $D_2$ and $P_2$, with respect to both end sections, as shown in the plan view of FIG. 2. In this way, an ample margin can be attained.

On the first interlayer insulating film 15 in which the inlaid interconnection 16 ($L_1$) is formed, a second interlayer insulating film 17 is formed to a thickness of 10–150 nm or so from a silicon oxide film or the like. Further, contact holes formed through this second interlayer insulating film 17 and the first interlayer insulating film 15 are filled with a conductive metal such as tungsten to set contact plugs. These contact plugs are plugs 19–26 being in contact with respective source/drain regions of 6 transistors and a plug 18 being in contact with the gate electrode 9, which is used by the driver transistor D, and the load transistor $P_1$ in common.

On the top of the second interlayer insulating film 17, there is formed a local interconnection 27 ($L_2$) from TiN or such to a thickness of 100–200 nm or so. The local interconnection 27 ($L_2$) is set connecting electrically to the plug 18 that is connected with the gate electrode 9, common to the driver transistor D, and the load transistor $P_1$, the plug 19 that is connected with the drain region of the driver transistor $D_2$, and the plug 20 that is connected with the drain region of the load transistor $P_2$. Further, the disposition of the local interconnection 27 ($L_1$) is arranged in such a way that a portion thereof overlaps, at least, a portion of the top surface of the afore-mentioned inlaid interconnection 16 ($L_1$) which is the other local interconnection, with the second interlayer insulating film 17 lying therebetween. The local interconnection 27 ($L_2$) and the inlaid interconnection 16 ($L_1$), separated by the second interlayer insulating film, constitute a capacitor element. In view of the effect of a capacitor element, the local interconnection 27 ($L_2$) is preferably set covering the top surface of the inlaid interconnection 16 ($L_1$) as much as possible, and, in the structure shown in FIG. 2, the local interconnection 27 ($L_2$) covers the entire top surface of the inlaid interconnection 16 ($L_1$).

Further, in order to facilitate the connection with the via plugs which are further connected to the above layers, on the contact plugs 21–26, there are provided with respective rectangular conductive film patterns 28–33, which are concurrently formed with the local interconnection 27 ($L_2$) by patterning.

On the top of the second interlayer insulating film 17 in which the local interconnection 27 ($L_2$) is formed, a third interlayer insulating film 34 is formed from a silicon oxide film or the like and, thereon, a supply voltage line 41 to apply a supply voltage $V_{cc}$, a reference voltage line 42 to apply a reference voltage $V_{ss}$, are formed along the afore-mentioned first direction. The supply voltage line 41 is electrically connected through via plugs 36 and 37 set in the third interlayer insulating film 34 and contact plugs 22 and 23 set in the first and second interlayer insulating films, to the source regions of the load transistors $P_1$ and $P_2$, respectively. The reference voltage line 42 is electrically connected through via plugs 35 and 38 set in the third interlayer insulating film 34 and contact plugs 21 and 24 set in the first and second interlayer insulating films, to the source regions of the driver transistors $D_1$ and $D_2$, respectively. These interconnections can be formed, for example, from a patterned aluminium film or a layered film comprising an aluminium film and films of TiN or the like which may be laid over the aluminium film as an anti-reflection coating film, and laid below the aluminium film as a barrier metal film.

Further, in order to facilitate the connection with the via plugs which are further connected to the above layers, on the top of the plugs 39 and 40 which are set in the third interlayer insulating film 34 for making electrical connection to one side of the source/drain regions of the transmission transistors $T_1$ and $T_2$, there are provided with respective rectangular conductive film patterns 43 and 44, which are concurrently formed with the supply voltage line 41 and the reference voltage line 42 by patterning.

On the top of the third interlayer insulating film 34 in which the supply voltage line 41 and the reference voltage line 42 are formed, a fourth interlayer insulating film (not shown in the drawings) is formed from a silicon oxide film or the like and, thereon, a pair of bit lines $BL_1$ and $BL_2$ (not shown in the drawings) are formed along the afore-mentioned second direction. One of the bit lines $BL_1$ is electrically connected, through a via plug set in the fourth interlayer insulating film, and the via plug 40 set in the third interlayer insulating film and the contact plug 26 set in the first and second interlayer insulating films, to one side of the source/drain regions of the transmission transistor $T_1$. The other bit line $BL_2$ is electrically connected, through a via plug set in the fourth interlayer insulating film, and the via plug 39 set in the third interlayer insulating film and the contact plug 25 set in the first and second interlayer insulating films, to one side of the source/drain regions of the transmission transistor $T_2$. These interconnections can be formed, for example, from a patterned aluminium film or a layered film comprising an aluminium film and films of TiN or the like which may be laid over the aluminium film as an anti-reflection coating film, and laid below the aluminium film as a barrier metal film.

Figure 21:
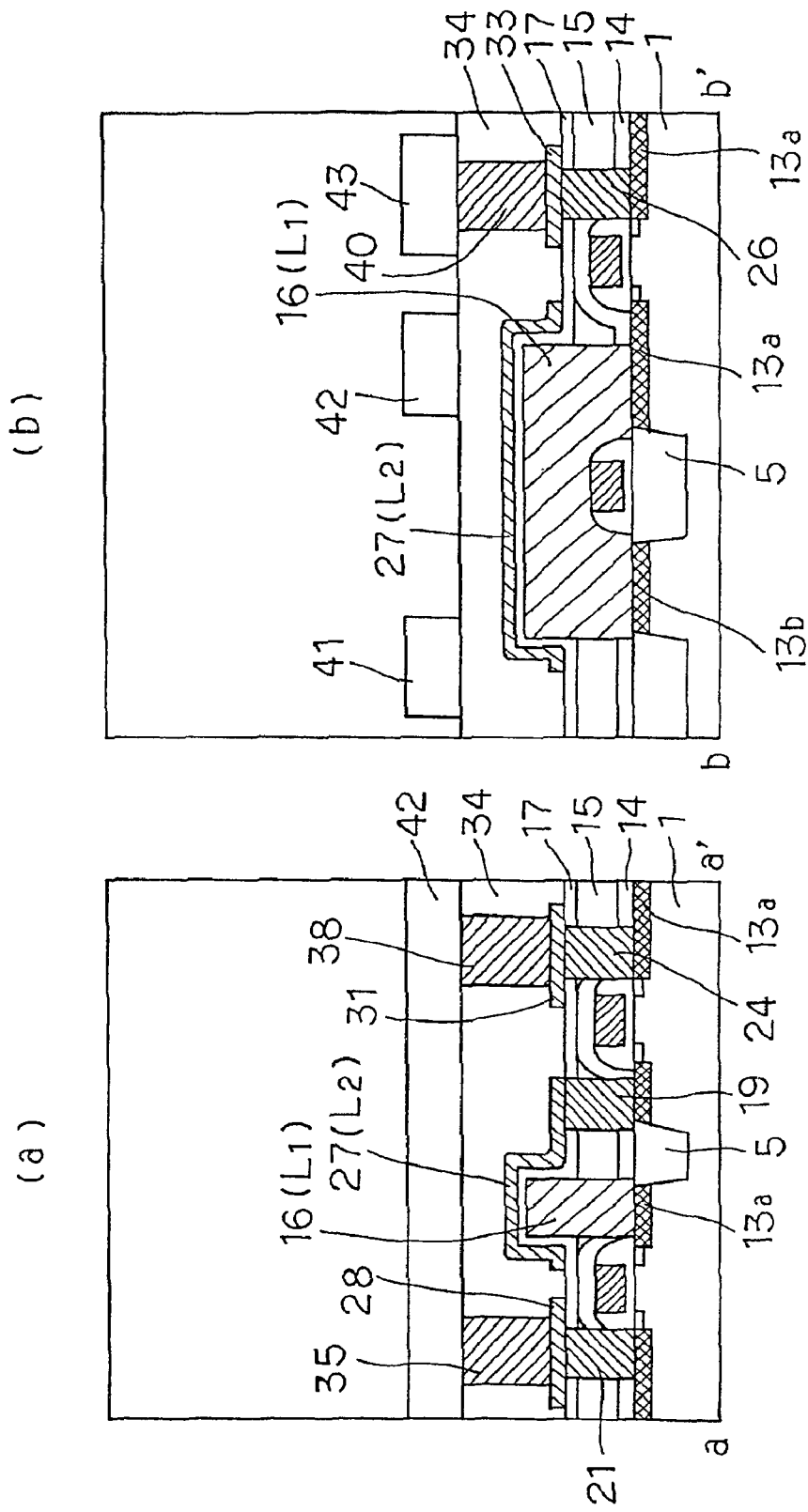
FIG. 21 is a cross-sectional view in explaining another embodiment of a SRAM memory cell in a semiconductor memory device according to the present invention.
Figure 22:
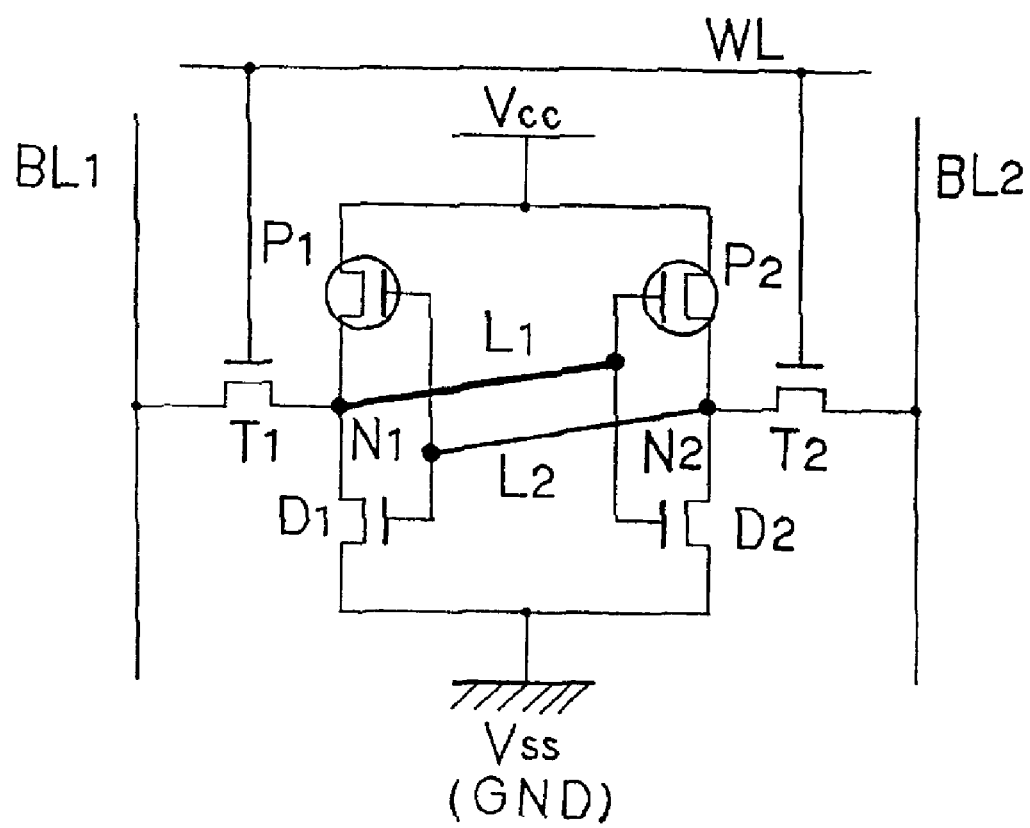
FIG. 22 is a circuit diagram of a conventional SRAM memory cell.

As the second embodiment of the present invention, a SRAM memory cell may have a structure that is the same as the above structure but the arrangement of a capacitor element, wherein deposition of local interconnections is arranged in such a way that, seen from the top surface of the substrate, a portion of the upper layer local interconnection (the plate-shaped interconnection) overlaps, at least, a portion of the top surface of the lower layer local interconnection (the inlaid interconnection) with an insulating film lying therebetween, and besides a portion of the upper layer local interconnection (the plate-shaped interconnection) partially covers the lateral face (a face parallel to the direction of the depth) of the lower layer local interconnection (the inlaid interconnection) with an insulating film lying therebetween. In this structure, a capacitor element is formed not only on the top surface of the lower layer local interconnection (the inlaid interconnection) but also on the lateral face thereof so that the capacitance of the element can be raised significantly. A cross-sectional view (corresponding to the plan view of FIG. 2) of one example of this embodiment is shown in FIG. 21.

Next, taking a manufacturing method of the first embodiment as an example, a method of manufacturing a SRAM memory cell in a semiconductor memory device of the present invention is described, with reference to the drawings. The plan view, herein, are presented with some insulating films appropriately omitted therefrom.

Figure 4:
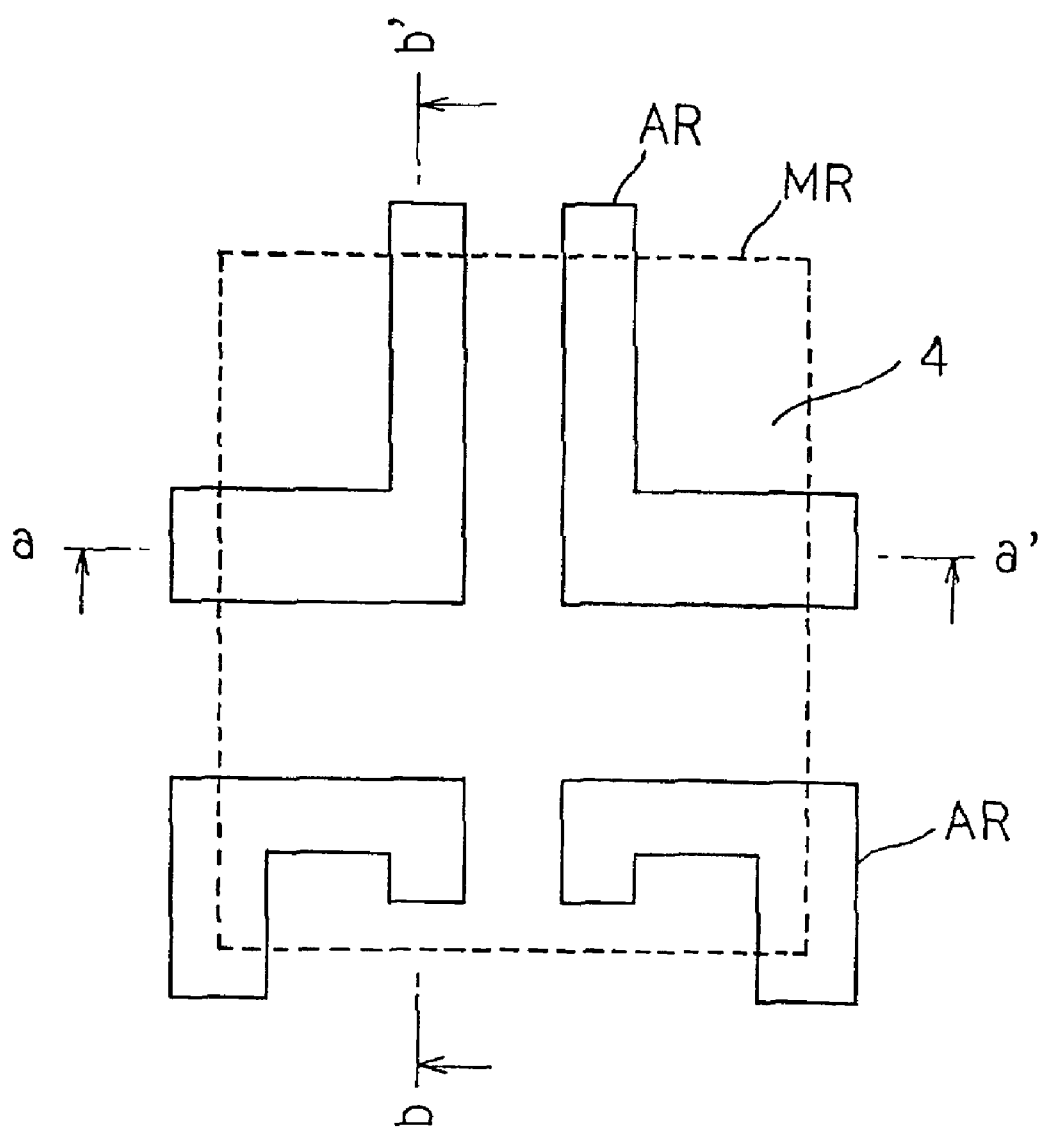
FIG. 4 is a plan view in explaining a manufacturing method of a SRAM memory cell in a semiconductor memory device according to the present invention.
Figure 5:
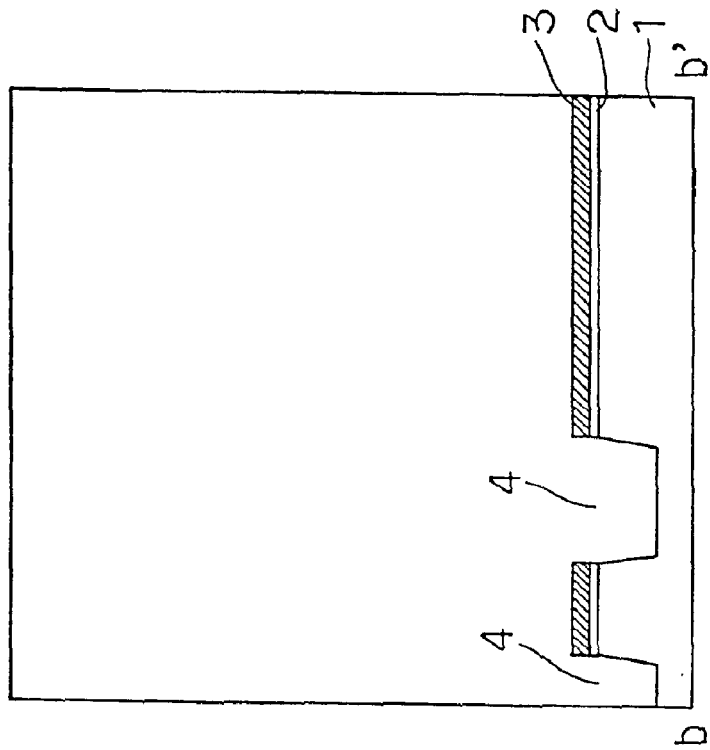
FIG. 5 is a cross-sectional view in explaining a manufacturing method of a SRAM memory cell in a semiconductor memory device according to the present invention.
Figure 5:
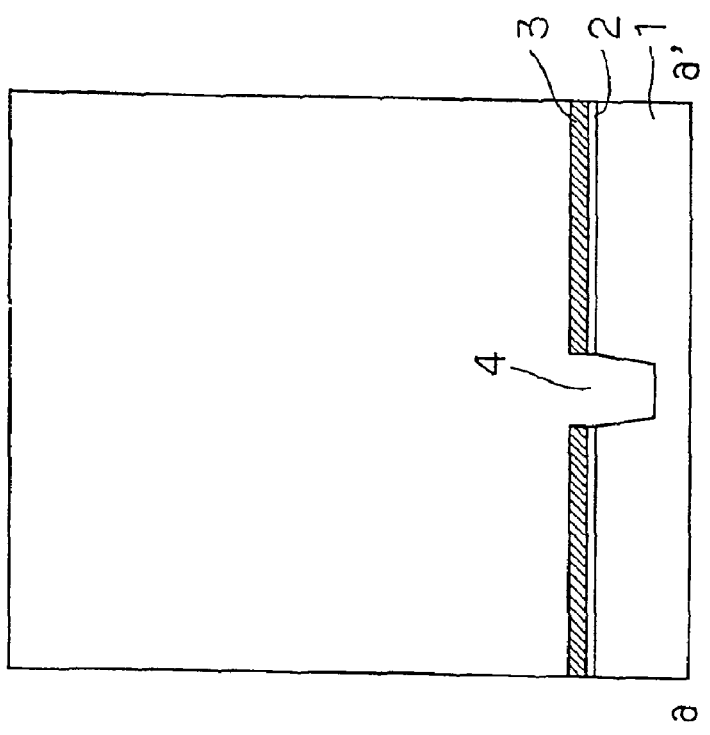

First, on the principal plane of a semiconductor substrate 1 made of a p-type single crystal silicon, a silicon oxide film 2 and a silicon nitride film 3 are formed, in succession, by a known method. Using, as a mask, a photoresist in the shape of a prescribed pattern which is formed by a known method, dry etching is then applied thereto and the silicon nitride film 3 and the silicon oxide film 2 are patterned. After that, using the remained silicon nitride film 3 and silicon oxide film 2 as a mask, the semiconductor substrate 1 is dry etched to form trenches 4 for element isolation (FIG. 4 and FIG. 5). In the drawings, hereat, regions indicated by AR are active regions and, in this step, trenches for element isolation are formed in regions other than ARs. Further, a region indicated by MR, which is encircled by a dotted line represents a region for one memory cell. A plurality of memory cells are disposed in such a way that, with each side of a rectangle indicated by MR that runs along the afore-mentioned first direction (the left-right direction in FIG. 4) being used as a line of symmetry, the shapes indicated by AR between neighbouring memory cells in the afore-mentioned second direction (the top-down direction in FIG. 4) become line symmetric images (mirror operation), while, with each side of a rectangle indicated by MR that runs along the afore-mentioned second direction being used as a datum line, the shapes indicated by AR between neighbouring memory cells in the afore-mentioned first direction become images shifted to the first direction (parallel translation). It is also possible to dispose memory cells so that the shapes indicated by AR between every two neighbouring memory cells may become line symmetric, with respect to the common side of rectangles indicated by MR.

Figure 6:
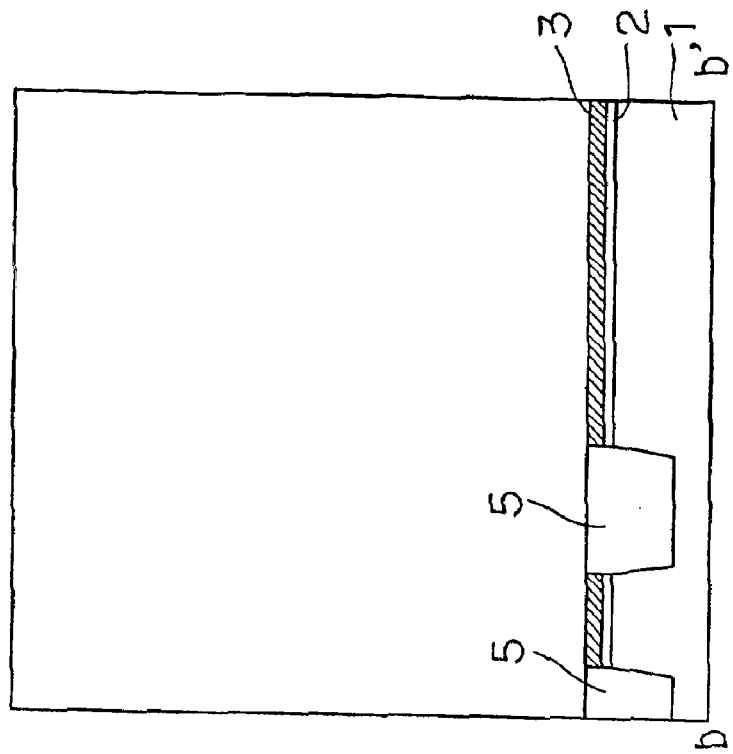
FIG. 6 is a cross-sectional view in explaining a manufacturing method of a SRAM memory cell in a semiconductor memory device according to the present invention.
Figure 6:
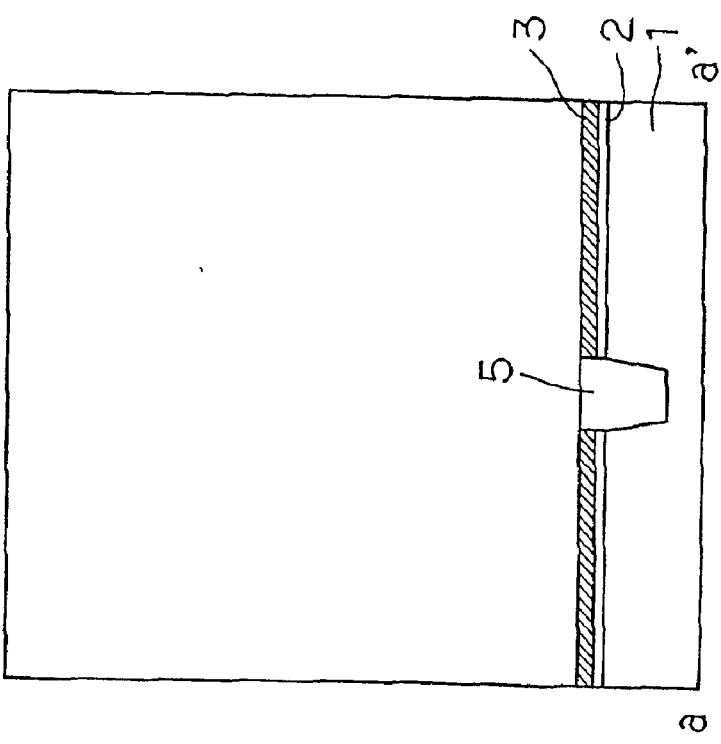

Next, as shown in FIG. 6, the inside of the trenches 4 is filled with a silicon oxide film, and element isolation regions 5 are formed. The formation of the element isolation regions 5 can be made as follows. On a semiconductor substrate 1 in which trenches 4 are set, a silicon oxide film is formed thick enough to fill up the inside of the trenches 4 completely by the CVD (Chemical Vapour Deposition) method, and thereafter, using the silicon nitride film 3 as a stopper, etch back or chemical mechanical polishing (CMP) is applied to the thickly formed silicon oxide film to remove the silicon oxide film other than portions thereof lying inside of the trenches 4, whereby the element isolation regions 5 are formed.

Figure 7:
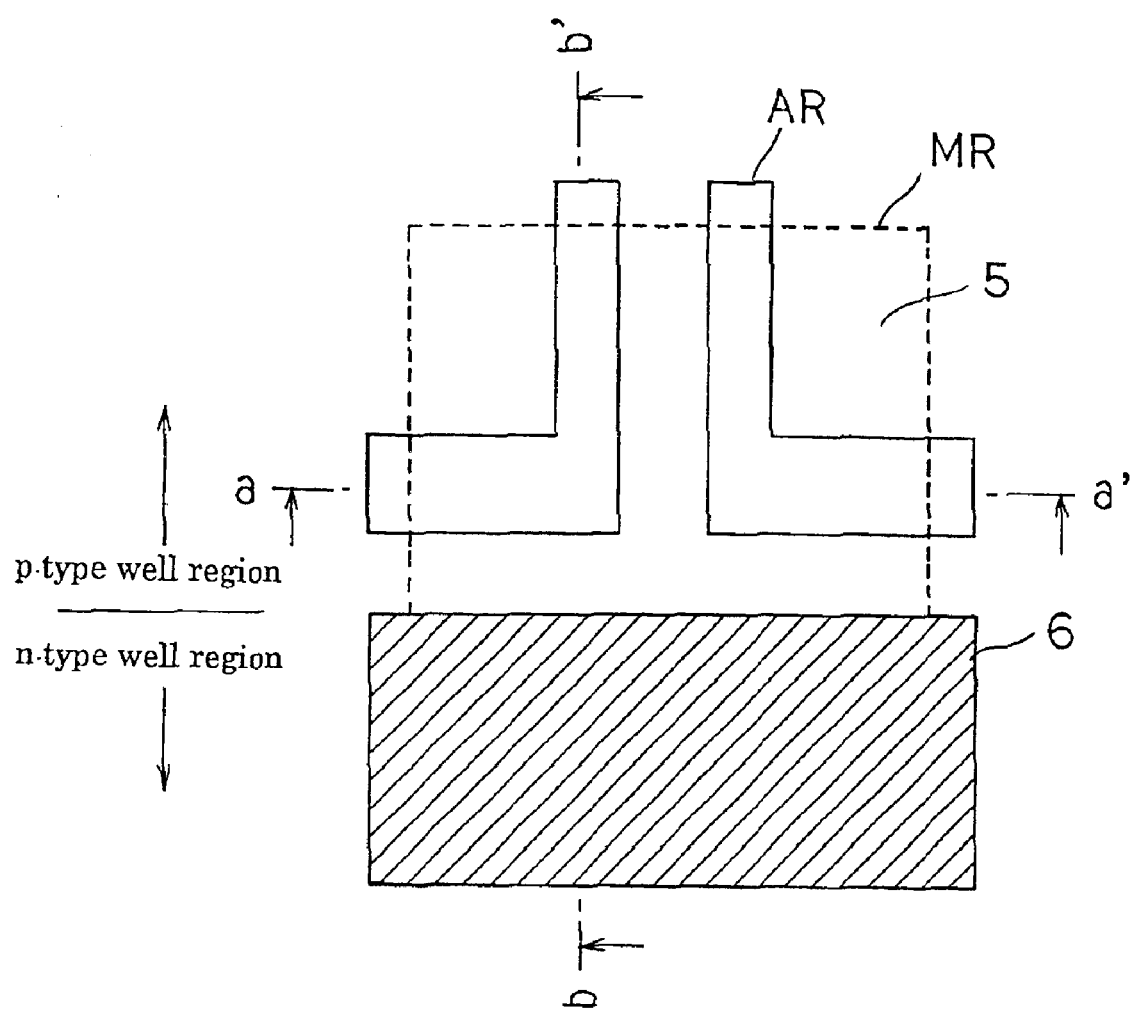
FIG. 7 is a plan view in explaining a manufacturing method of a SRAM memory cell in a semiconductor memory device according to the present invention.
Figure 8:
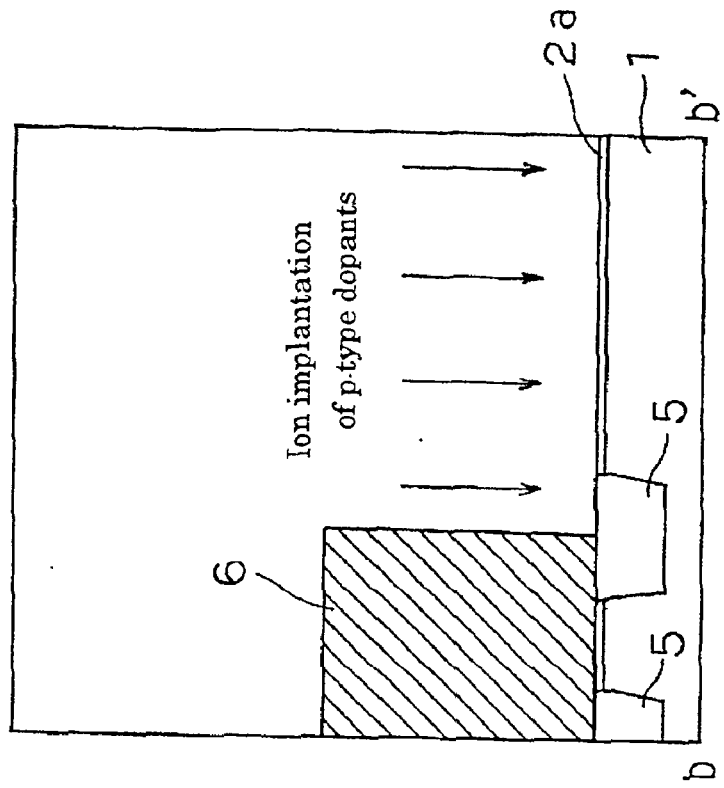
FIG. 8 is a cross-sectional view in explaining a manufacturing method of a SRAM memory cell in a semiconductor memory device according to the present invention.
Figure 8:
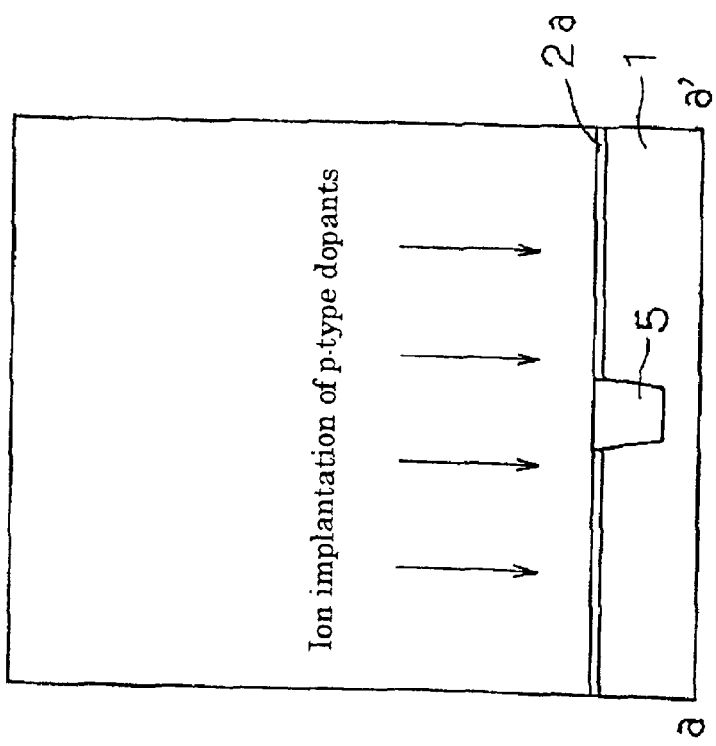

Next, after the silicon nitride film 3 and the silicon oxide film 2 on the semiconductor substrate 1 are removed by etching, a thin silicon oxide film (a sacrifice oxide film) 2a with a thickness of 10–30 nm or so is formed and then a resist 6 is formed in a region where load transistors $P_1$ and $P_2$ are to be formed, as shown in FIG. 7 and FIG. 8. Using this resist 6 and the afore-mentioned oxide film 2a as a mask and a through film, respectively, ion-implantation of p-type dopants (for example, boron) is applied thereto to form a p-type well region where load transistors $D_1$ and $D_2$ and transmission transistors $T_1$ and $T_2$ are to be formed later. Next, after removing the resist 6, another resist is formed on the p-type well region, and using this resist and the afore-mentioned oxide film 2a as a mask and a through film, respectively, ion implantation of n-type dopants (for example, phosphorus or arsenic) is applied thereto to form an n-type well region where load transistors $P_1$ and $P_2$ are to be formed later.

Figure 9:
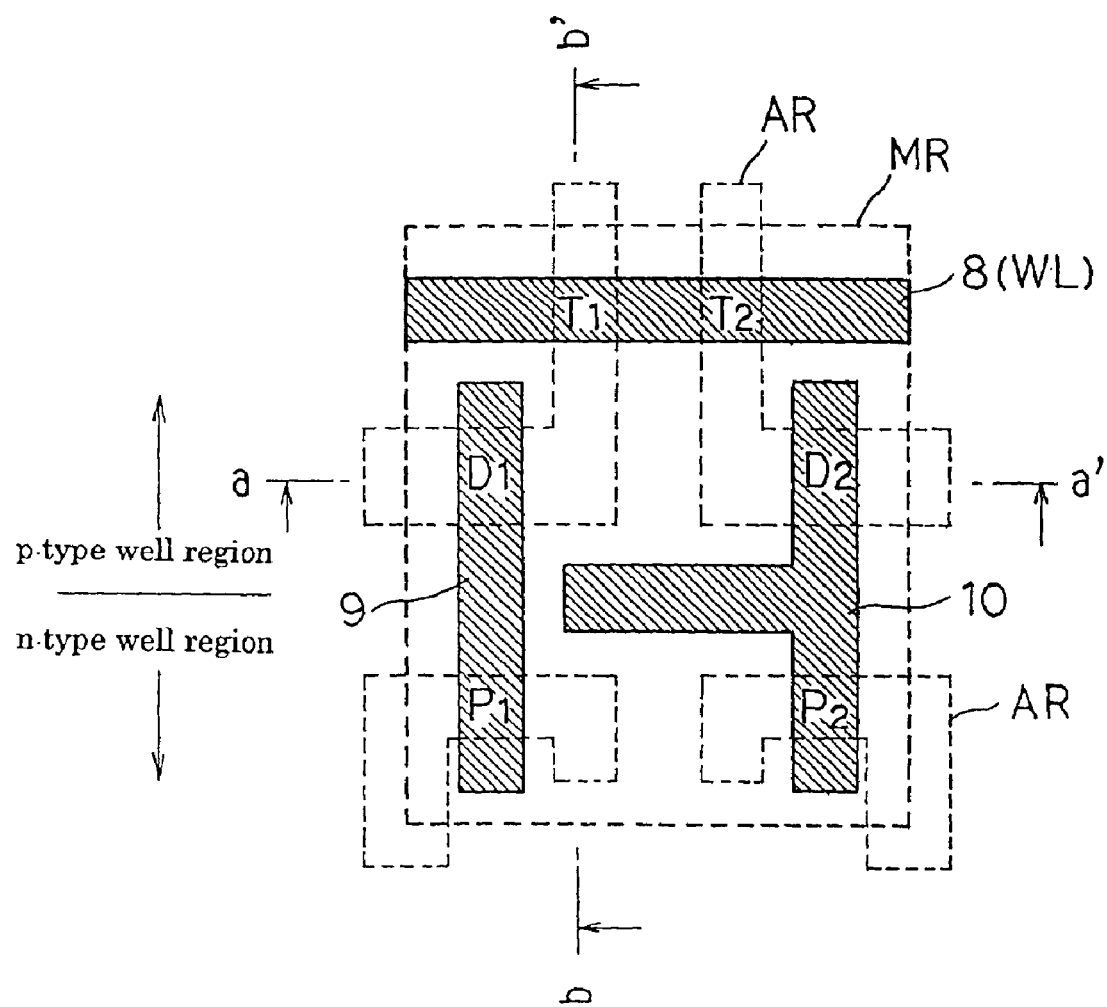
FIG. 9 is a plan view in explaining a manufacturing method of a SRAM memory cell in a semiconductor memory device according to the present invention.
Figure 10:
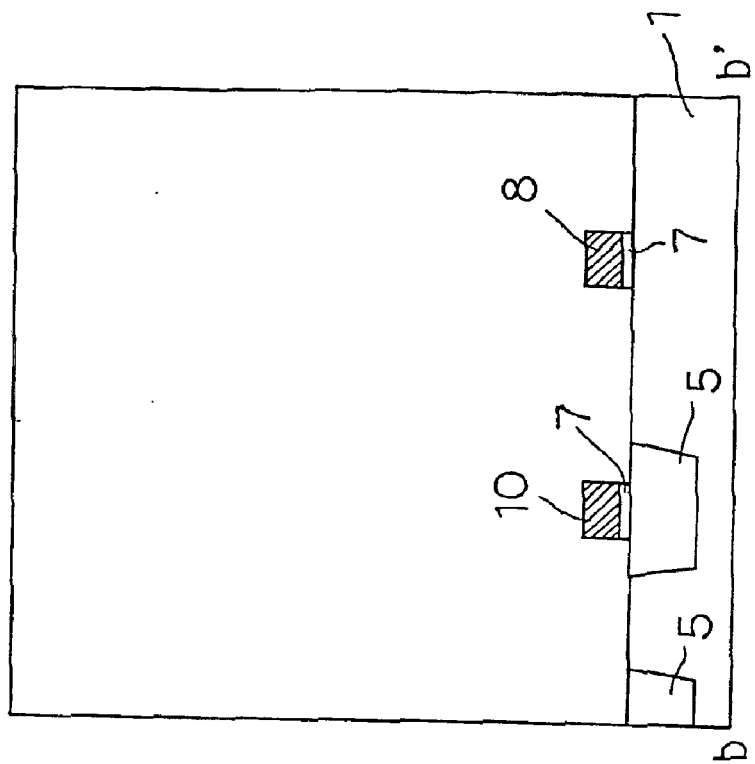
FIG. 10 is a cross-sectional view in explaining a manufacturing method of a SRAM memory cell in a semiconductor memory device according to the present invention.
Figure 10:
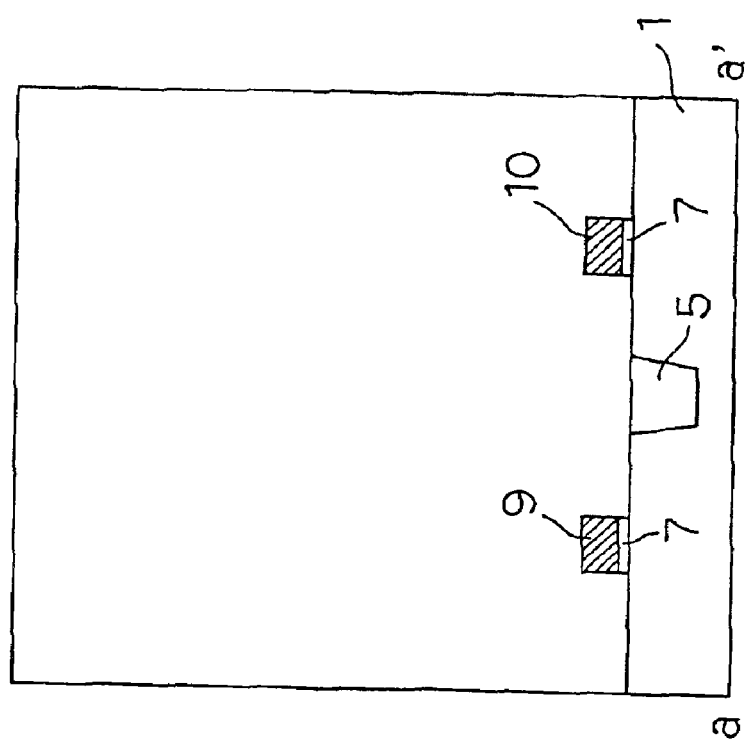

Next, after removing the silicon oxide film (the sacrifice oxide film) 2a lying on the semiconductor substrate, a gate oxide film is formed by the thermal oxidation method, and then a doped polycrystalline silicone film is formed. Thereat, a refractory metal silicide film such as a tungsten silicide film may be formed on the doped polycrystalline silicone film, and then a silicone oxide film for formation of a cap layer may be formed thereon. Next, using a photoresist formed into a prescribed pattern as a mask, dry etching is performed and thereby the doped polycrystalline silicone film and the gate oxide film (together with the refractory metal silicide film and the silicon oxide film, in the case that this silicide film and oxide film are formed thereon) are concurrently patterned, and a gate electrode 8 (a word line WL) of the transmission transistors $T_1$ and $T_2$, gate electrodes 9 and 10 of the driver transistors $D_1$ and $D_2$ and load transistors $P_1$ and $P_2$ are formed, as shown in FIG. 9 and FIG. 10.

Figure 11:
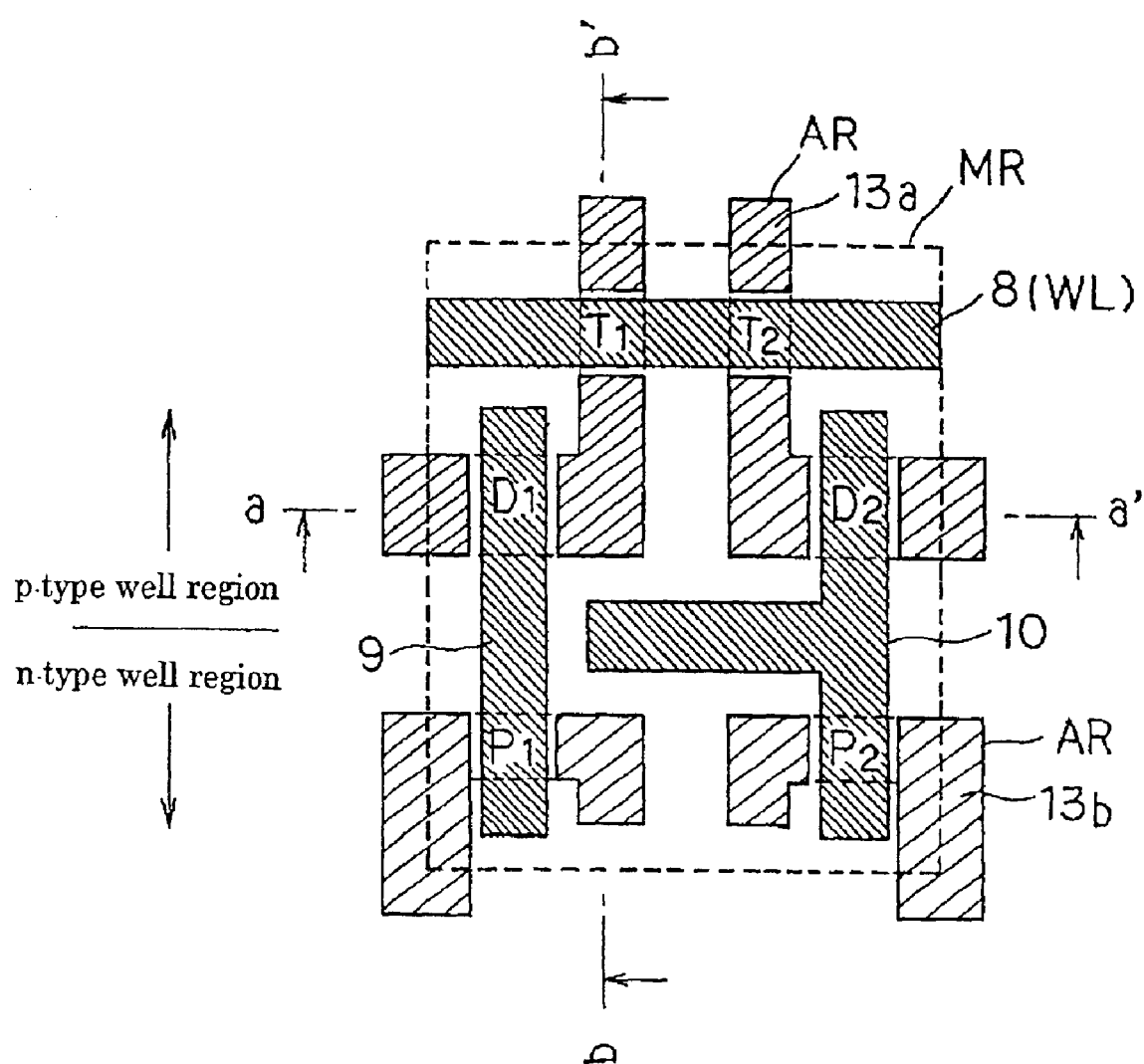
FIG. 11 is a plan view in explaining a manufacturing method of a SRAM memory cell in a semiconductor memory device according to the present invention.
Figure 12:
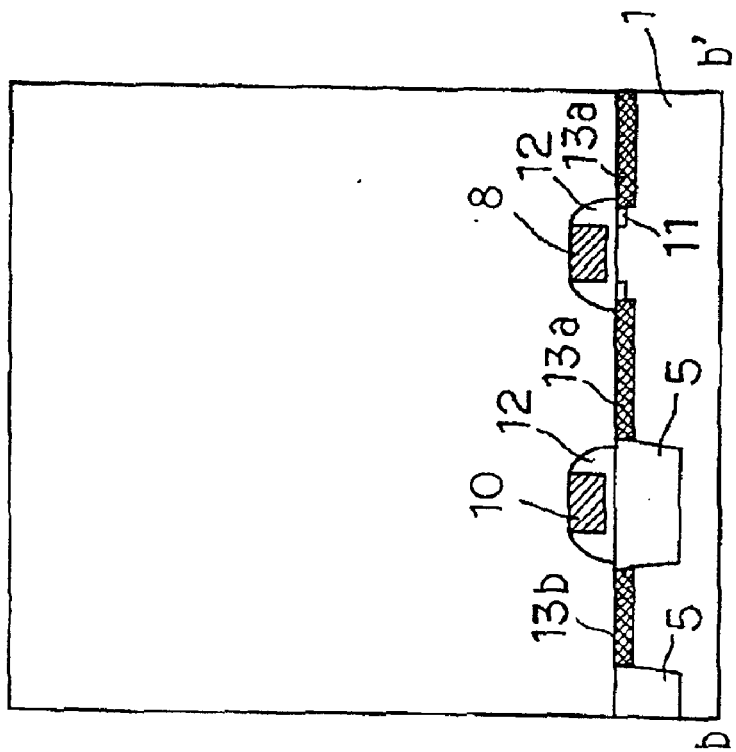
FIG. 12 is a cross-sectional view in explaining a manufacturing method of a SRAM memory cell in a semiconductor memory device according to the present invention.
Figure 12:
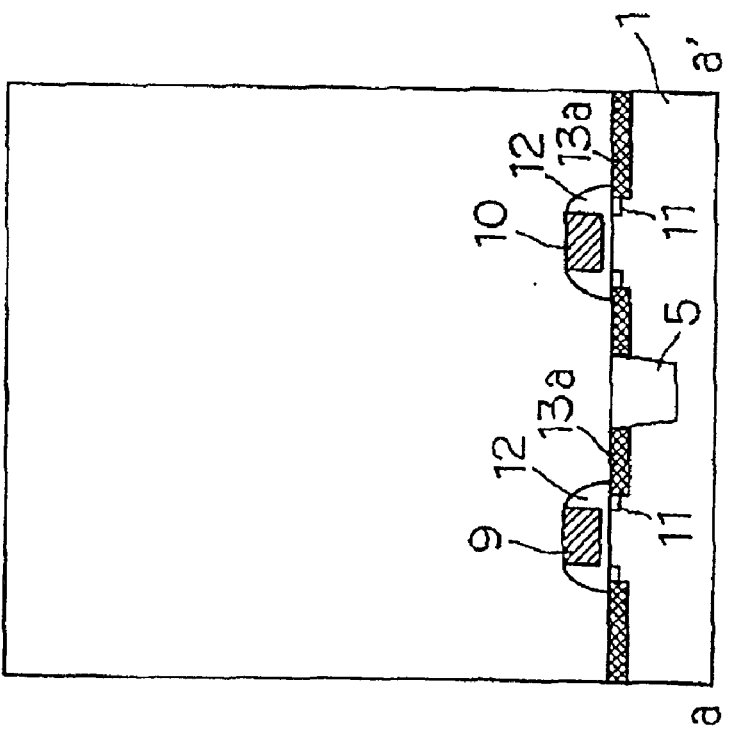

Next, a transistor structure shown in FIG. 11 and FIG. 12 is formed as follows. Using a resist formed on the n-type well region as a mask, ion implantation of n-type dopants (for example, phosphorus or arsenic) is applied thereto with a relatively small dose to form LDD (Lightly-Doped Drain) regions 11 in the p-type well region. After removing this resist, using another resist formed on the p-type well region as a mask, ion implantation of p-type dopants (for example, boron) is similarly applied thereto to form LDD regions 11 in the n-type well region. Next, after this resist is removed, a silicon oxide film is formed on the substrate by the CVD method, and by subjecting this silicon oxide film to etch back, sidewalls 12 are formed on the lateral faces of the gate electrodes. The sidewalls may be formed from a layered film made of films of oxide-nitride-oxide or films of nitride-polysilicon. After that, using a resist formed on the n-type well region as a mask, ion implantation of n-type dopants is applied thereto with a relatively large dose to form n-type source/drain regions 13a in the p-type well region. Subsequently, after removing this resist, using another resist formed on the p-type well region as a mask, ion implantation of p-type dopants is similarly applied thereto to form p-type source/drain regions 13b in the n-type well region.

After this step is completed, on the source/drain regions, refractory metal silicide films are preferably formed. First, on the semiconductor substrate, a refractory metal (for example, Ti or Co) film is formed by the sputtering method or such. Next, by annealing, the refractory metal film and the source/drain regions are made to react with each other, and thereafter unreacted refractory metal is removed by etching, whereby a refractory metal silicide film is formed on the source/drain regions. If, in the step described above, no tungsten silicide film or silicon oxide film is formed on the gate electrodes, refractory metal silicide films are, hereat, formed on the gate electrodes.

Figure 13:
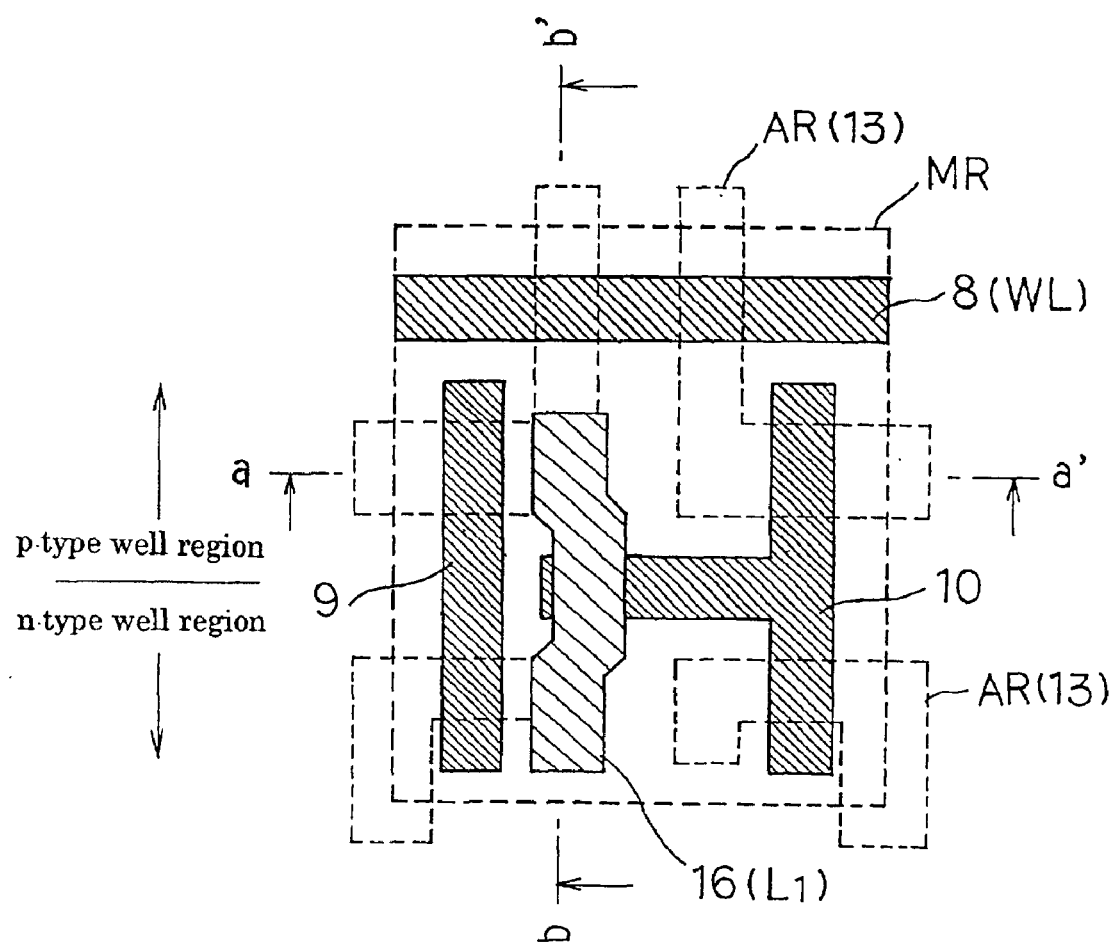
FIG. 13 is a plan view in explaining a manufacturing method of a SRAM memory cell in a semiconductor memory device according to the present invention.
Figure 14:
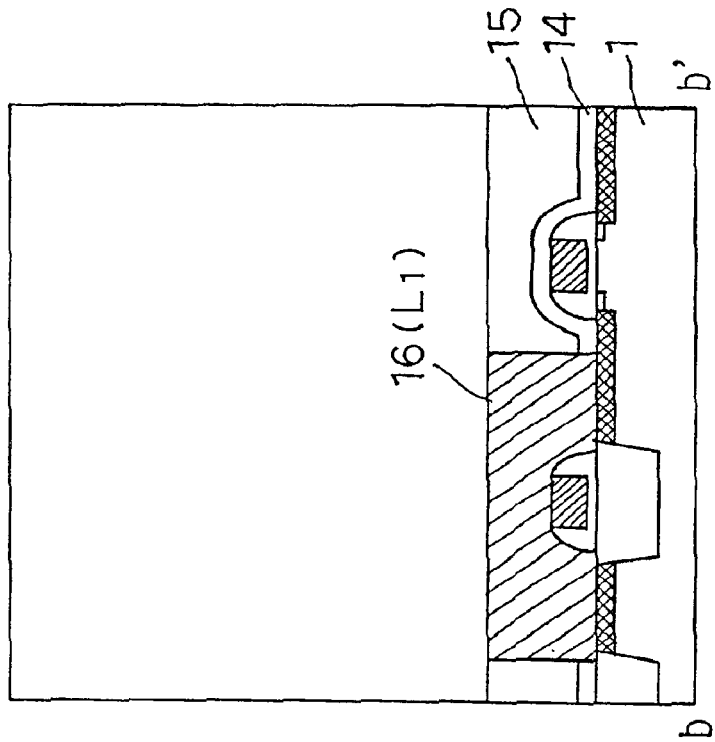
FIG. 14 is a cross-sectional view in explaining a manufacturing method of a SRAM memory cell in a semiconductor memory device according to the present invention.
Figure 14:
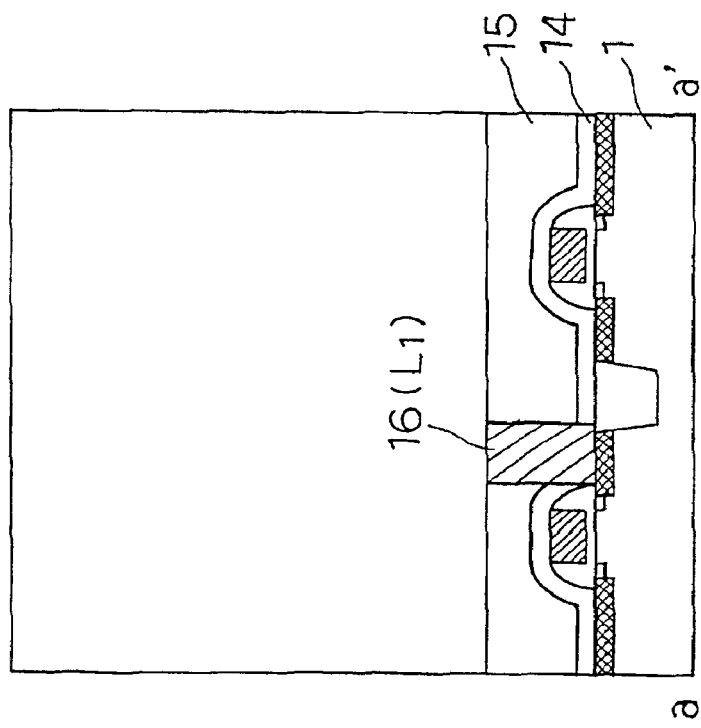

Next, after a silicon nitride film 14 is formed on the semiconductor substrate by the CVD method, an interlayer insulating film 15 is formed from PSG, BPSG or the like. Using a photoresist formed into a prescribed pattern as a mask, dry etching is then performed to make openings through the first interlayer insulating film 15 as well as the silicon nitride film 14, and thereby trenches to reach the substrate surface and the gate electrodes are formed. By filling up these trenches with a conductive metal such as W, a local interconnection 16 ($L_1$) made of an inlaid interconnection is formed, as shown in FIG. 13 and FIG. 14. Thereat, filling up the trenches with a conductive metal is carried out as follows. A barrier metal film is formed on the substrate including the inside of the trenches, for example, from a layered film of Ti/TiN or the like by the sputtering method or such, and thereafter, by the CVD method or such, a conductive metal film is formed from tungsten or the like so as to fill up the trenches, and, subsequently, CMP is applied to these metal films to remove the conductive metal film and the barrier metal film other than the portions thereof lying inside of the trenches.

Figure 15:
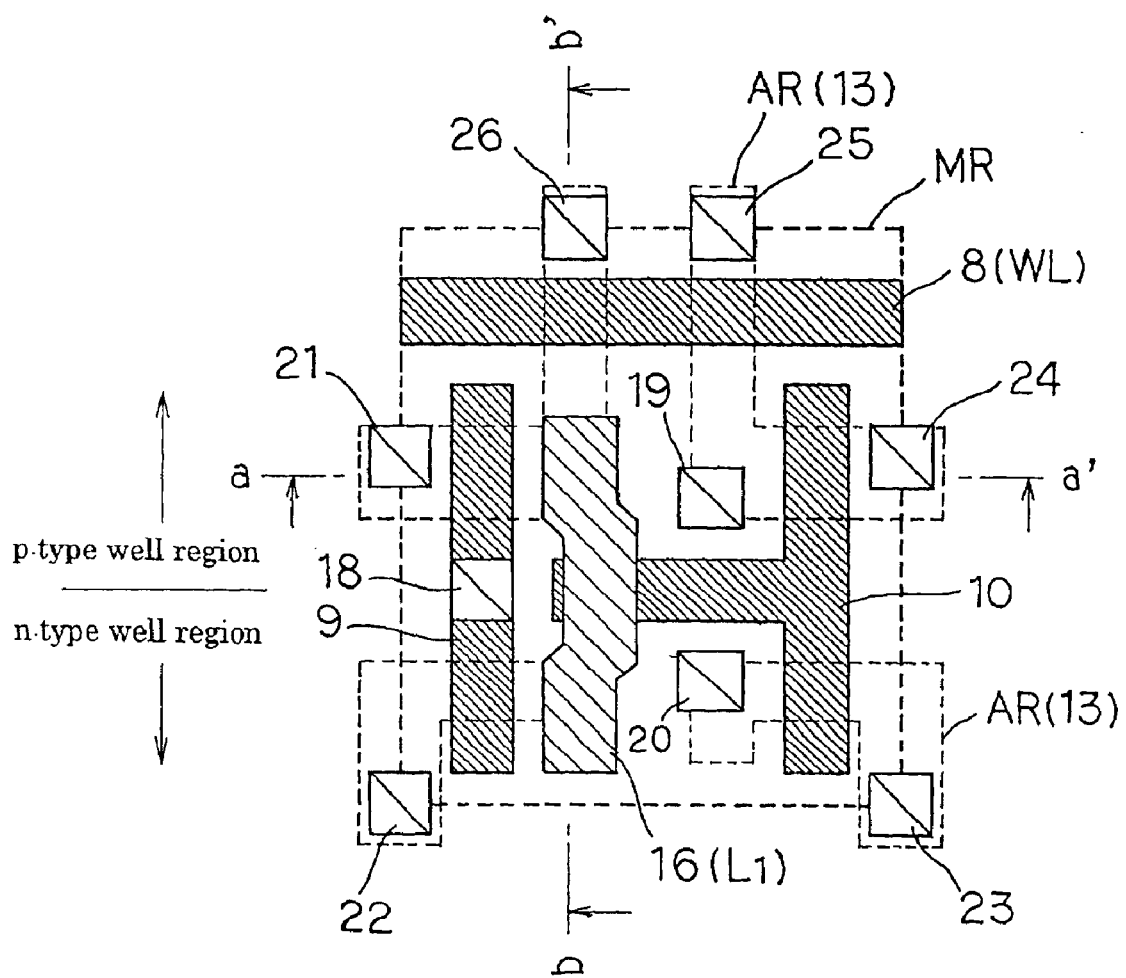
FIG. 15 is a plan view in explaining a manufacturing method of a SRAM memory cell in a semiconductor memory device according to the present invention.
Figure 16:
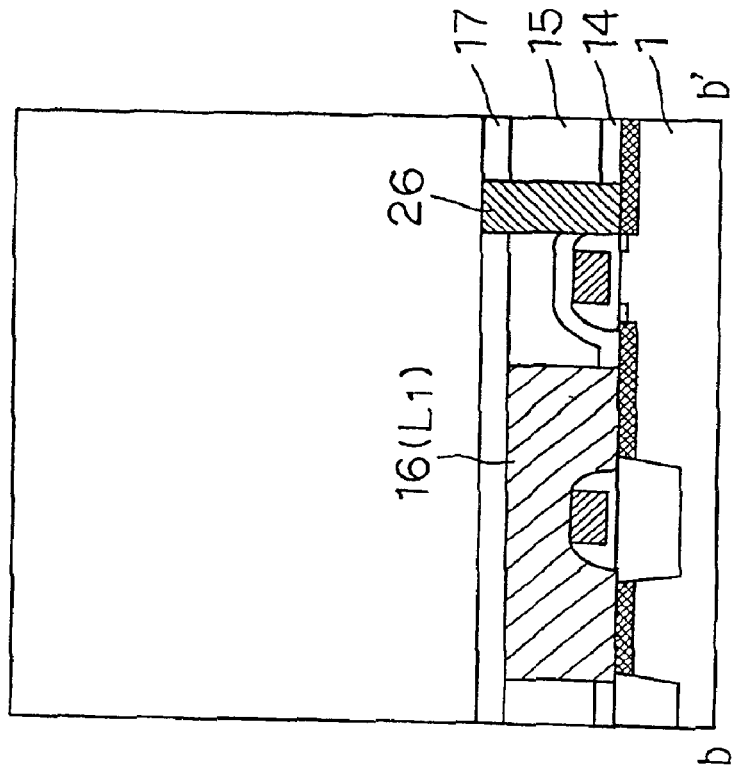
FIG. 16 is a cross-sectional view in explaining a manufacturing method of a SRAM memory cell in a semiconductor memory device according to the present invention.
Figure 16:
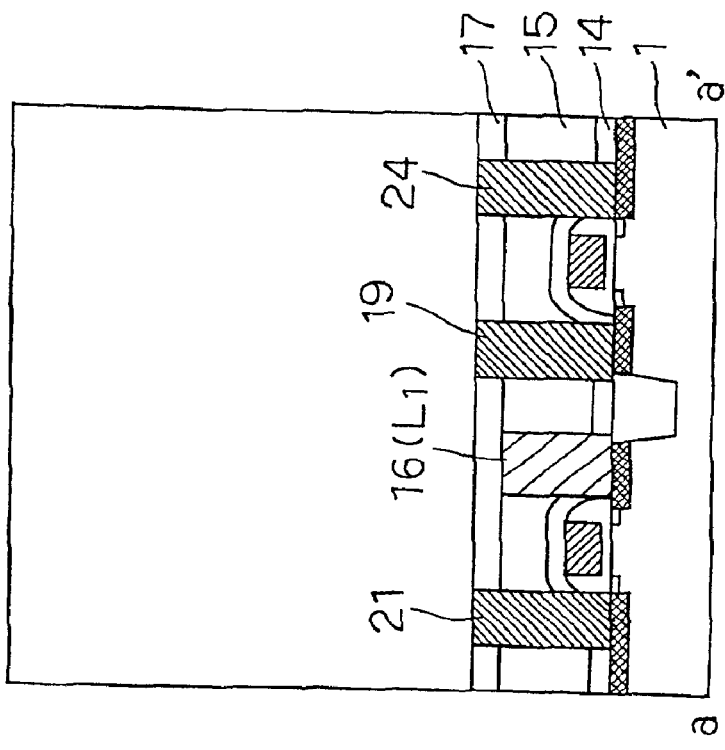

Next, after a second interlayer insulating film 17 is formed from a silicon oxide film or the like by the CVD method, using a photoresist as a mask, dry etching is performed and a contact hole to reach the gate electrode 9 and a contact hole to reach source/drain regions are concurrently formed. A barrier metal film is then formed on the substrate surface including the inside of the contact holes from Ti, TiN or a layered film of these, and thereafter a conductive metal film of W or the like is formed by the CVD method or such so as to fill up these contact holes, and then CMP is applied to these metal films to remove the conductive metal film and the barrier metal film lying in regions other than the inside of the contact holes. By this, as shown in FIG. 15 and FIG. 16, a contact plug 18 to reach the gate electrode 9, and contact plugs 19–26 to reach source/drain regions are concurrently formed. When etch back is performed, instead of the CMP, a local interconnection ($L_2$) 27 as well as conductive film patterns 28–33 can be formed, in place of a method described below, by making the barrier metal film made of Ti, TiN or a layered film of these remain on the surface and patterning this barrier metal film with a resist used as a mask.

Figure 17:
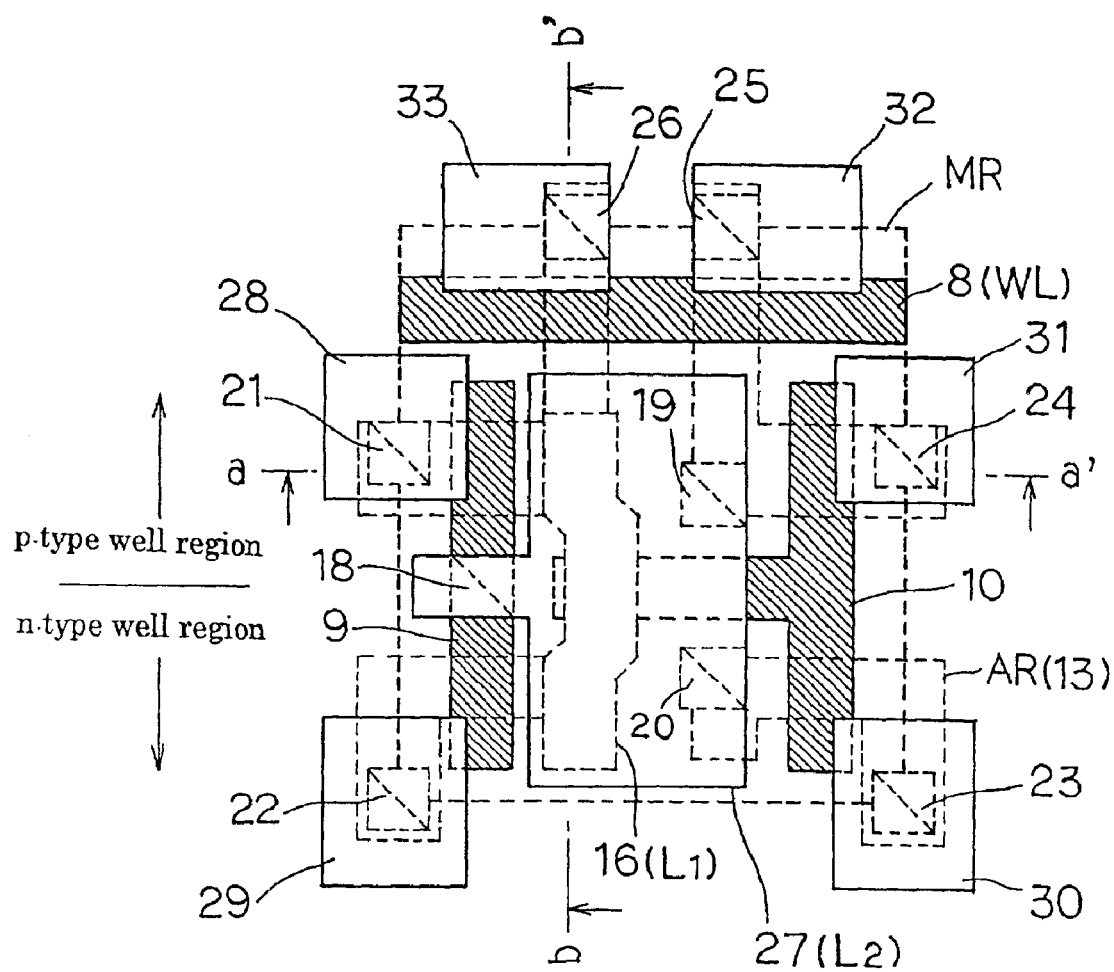
FIG. 17 is a plan view in explaining a manufacturing method of a SRAM memory cell in a semiconductor memory device according to the present invention.
Figure 18:
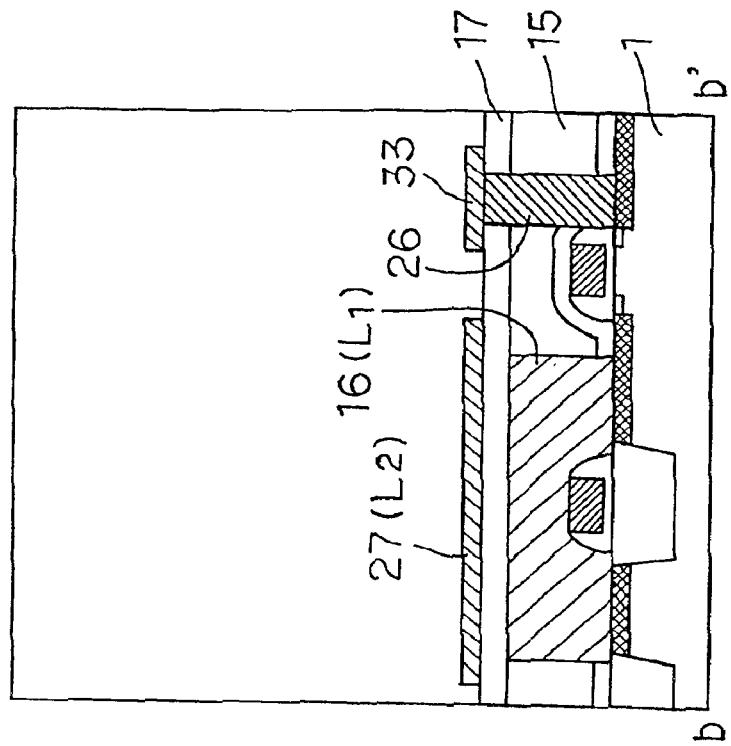
FIG. 18 is a cross-sectional view in explaining a manufacturing method of a SRAM memory cell in a semiconductor memory device according to the present invention.
Figure 18:
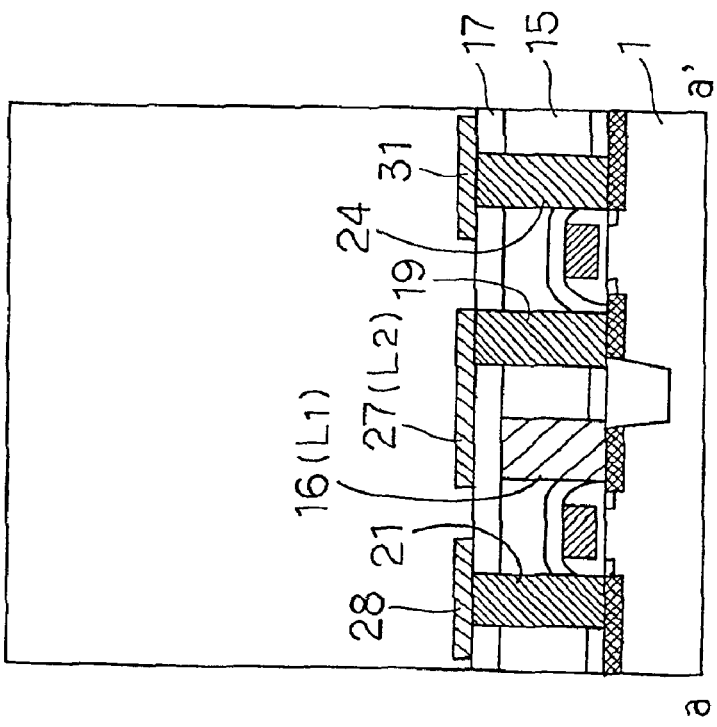

Next, a conductive film is formed from a TiN film or the like by theسputtering method or the CVD method, and patterning is applied to this conductive film with a photoresist used as a mask, whereby a local interconnection ($L_2$) 27 that is to be in contact with contact plugs 18, 19 and 20 is formed, as shown in FIG. 17 and FIG. 18. Thereat, the local interconnection ($L_2$) 27 is formed so that, seen from the top surface, a portion thereof overlaps, at least, a portion of the lower layer local interconnection ($L_1$) 16 with the second interlayer insulating film 17 lying therebetween. In the drawings, the local interconnection ($L_2$) 27 is formed so as to overlap the entire top surface of the lower layer local interconnection ($L_1$) 16.

When patterning to form the local interconnection ($L_2$) 27 is carried out, on contact plugs 21–26, rectangular conductive film patterns 28–33 that are in contact therewith and covering the top surface thereof are concurrently formed, respectively, in order to facilitate the connection between respective contact plugs 21–26 and corresponding via plugs that are to be formed later in upper layers.

Figure 19:
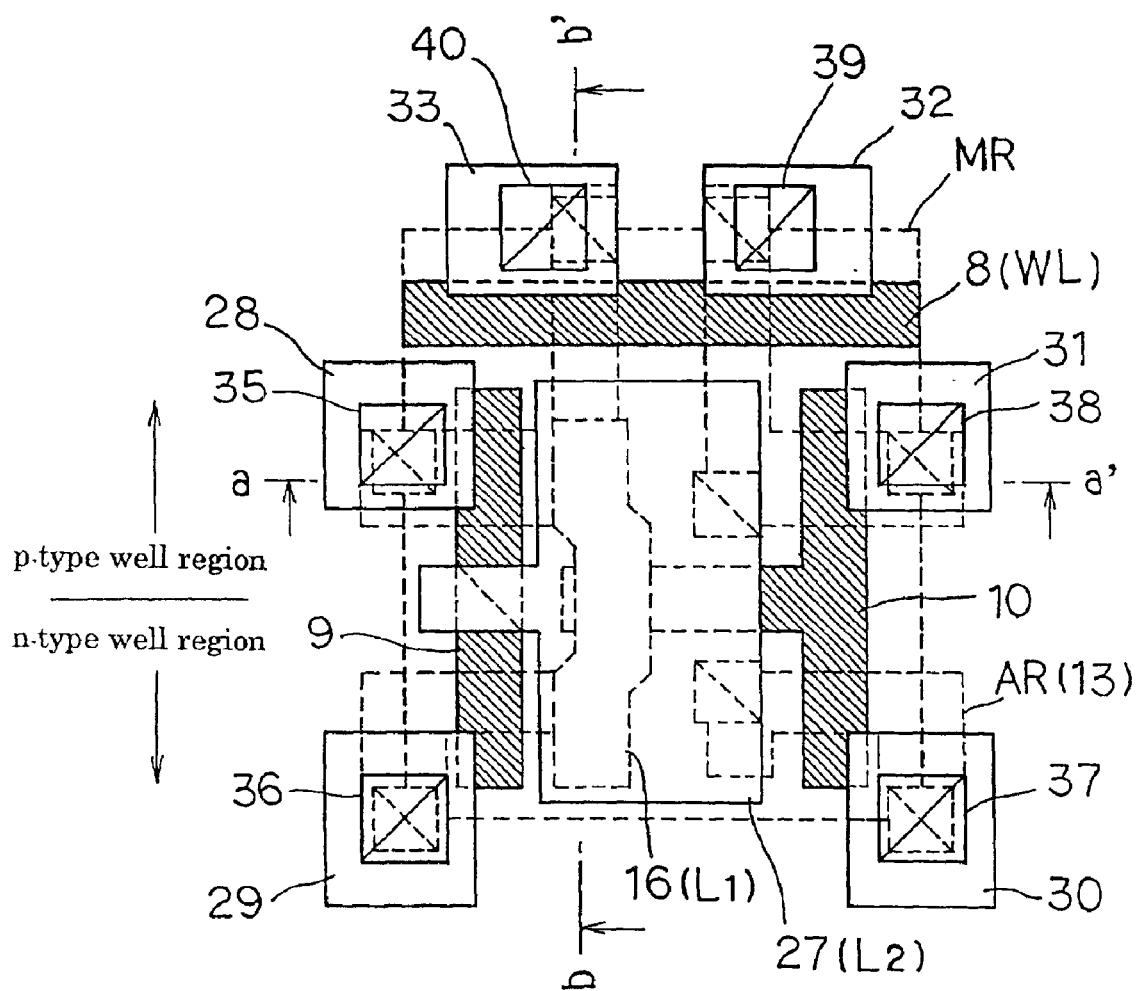
FIG. 19 is a plan view in explaining a manufacturing method of a SRAM memory cell in a semiconductor memory device according to the present invention.
Figure 20:
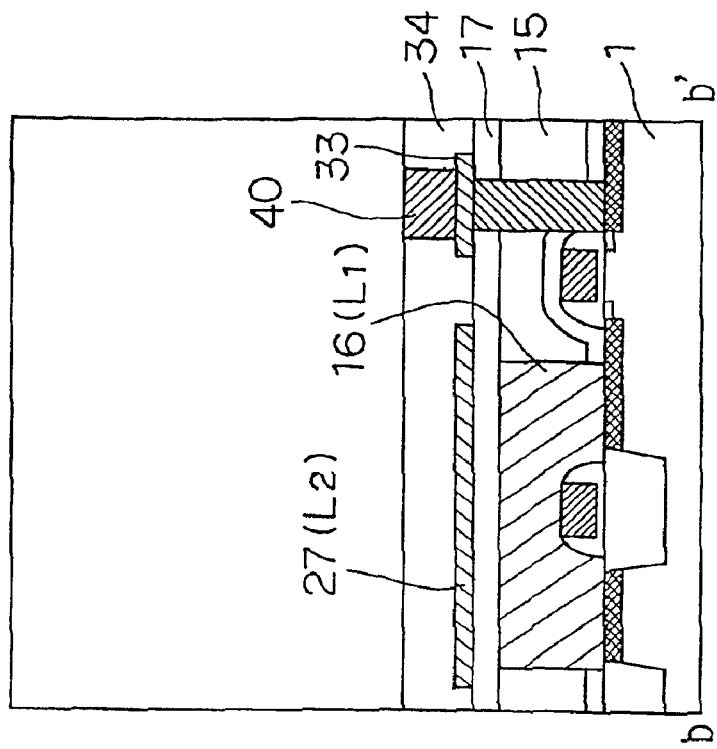
FIG. 20 is a cross-sectional view in explaining a manufacturing method of a SRAM memory cell in a semiconductor memory device according to the present invention.
Figure 20:
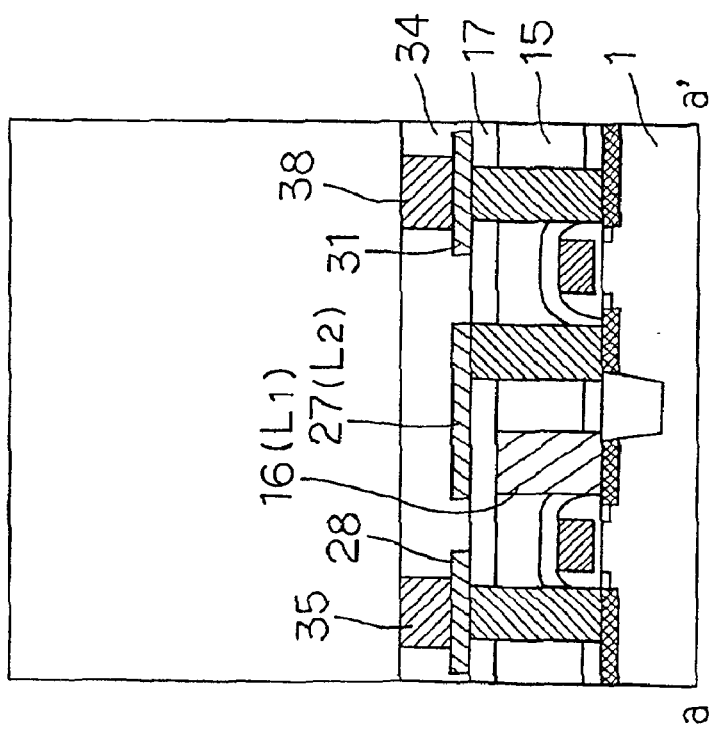

Next, after a third interlayer insulating film 34 is formed from a silicon oxide film or the like by the CVD method, by applying dry etching thereto with a photoresist used as a mask, via holes to reach respective conductive film patterns 28–33 are formed. A barrier metal film is then formed on the substrate surface including the inside of via holes, and thereafter a conductive metal film is formed from W or the like by the CVD method or such so as to fill up these via holes, and by applying the CMP to these metal films, the conductive metal film and the barrier metal film lying in regions other than the inside of the via holes are removed, whereby via plugs 35–40 reaching respective conductive film patterns 28–33 are formed, as shown in FIG. 19 and FIG. 20.

Figure 3:
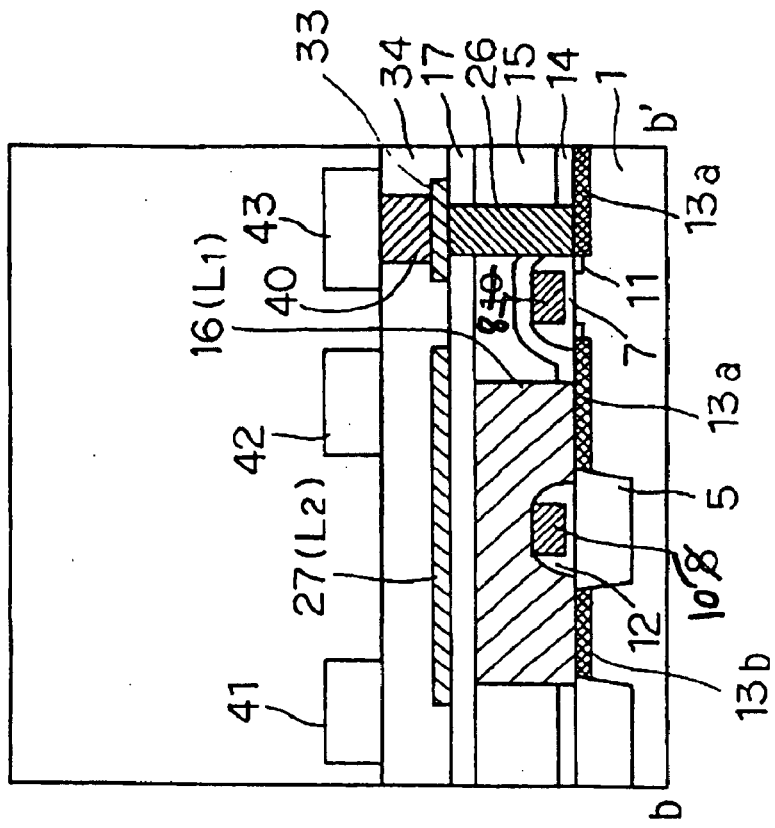
FIG. 3 is a cross-sectional view in explaining an embodiment of a SRAM memory cell in a semiconductor memory device according to the present invention.
Figure 3:
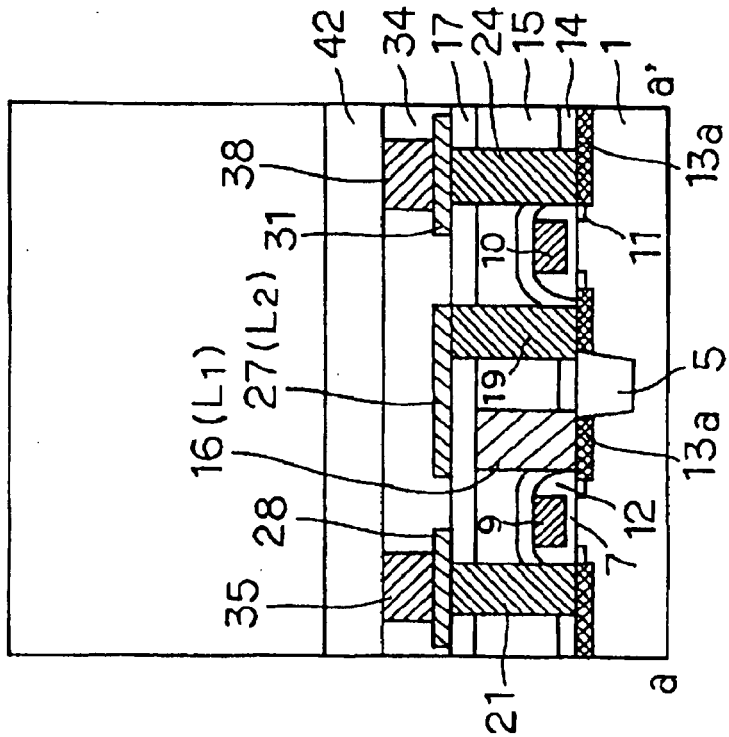

Next, on the third interlayer insulating film 34, a supply voltage line 41 for applying a supply voltage $V_{cc}$ and a reference voltage line 42 for applying a reference voltage $V_{ss}$ are formed, as shown in FIG. 2 and FIG. 3. These interconnections can be formed by forming an aluminium film on the third interlayer insulating film 34 by the sputtering method or such, and thereafter applying dry etching thereto, with a photoresist used as a mask, to pattern the aluminium film. Thereat, instead of the aluminium film, there may be set a layered film for which layers of a barrier metal film (TiN film or the like), an aluminium film and an anti-reflection coating film (TiN film or the like) are laid in succession. The supply voltage line 41 is in contact with via plugs 36 and 37 and electrically connected to the source regions of the load transistors $P_1$ and $P_2$, respectively. The reference voltage line 42 is in contact with via plugs 35 and 38 and electrically connected to the source regions of the driver transistors $D_1$ and $D_2$, respectively.

When patterning to form the supply voltage line 41 and the reference voltage line 42 is carried out, on via plugs 39 and 40, rectangular conductive film patterns 43 and 44 that are in contact therewith and covering the top surface thereof are concurrently formed respectively, in order to facilitate the connection between respective via plugs 39 and 40 connected to one side of the source/drain regions of the transmission transistors and the corresponding via plugs connected to bit lines $BL_1$ and $BL_2$ that are to be formed later, respectively.

Next, on the third interlayer insulating film 34 on which the supply voltage line 41, the reference voltage line 42 or the like are formed, a fourth interlayer insulating film is formed from silicon oxide or the like by the CVD method. Dry etching is then applied thereto with a photoresist used as a mask, which forms via holes to reach conductive film patterns 43 and 44 which are formed on via plugs 39 and 40, respectively. Subsequently, after a barrier metal film is formed on the fourth interlayer insulating film including the inside of these via holes, a conductive metal film is formed by the CVD method from W or the like so as to fill up these via holes. The CMP is then performed to remove these metal films lying in regions other than the insides of via holes, and thereby formation of via plugs are accomplished.

Next, on the fourth interlayer insulating film in which these via plugs are formed, bit lines $BL_1$ and $BL_2$ are formed. These bit lines can be formed by forming an aluminium film on the fourth interlayer insulating film by the sputtering method or such, and thereafter applying dry etching thereto, with a photoresist used as a mask, to pattern the aluminium film. Thereat, instead of the aluminium film, there may be set a layered film for which layers of a barrier metal film (TiN film or the like), an aluminium film and an anti-reflection coating film (TiN film or the like) are laid in succession. The bit lines are in contact with one of via plugs formed in the fourth interlayer insulating film, respectively, and are electrically connected to one side of the source/drain regions of one of the transmission transistors $T_1$ and $T_2$.

Through the steps described above, fabrication of a memory cell of the present embodiment is accomplished. After this, prescribed steps, for example, of forming a passivation film on the fourth interlayer insulating film on which bit lines are formed, may be performed appropriately.

The structure of the second embodiment that is described as another embodiment with reference to FIG. 21 can be formed as follows.

Following the step of forming a structure shown in FIG. 14 (the step of forming an inlaid interconnection 16 ($L_1$)), etch back is performed so as to make the top surface of the first interlayer insulating film 15 lower than the top surface of the inlaid interconnection 16 and expose partially the lateral face of the inlaid interconnection.

Next, after a second interlayer insulating film 17 is formed from a silicon oxide film or the like by the CVD method, dry etching is applied thereto, with a photoresist used as a mask, to form, concurrently, a contact hole to reach the gate electrode 9 and a contact hole to reach source/drain regions. A barrier metal film is then formed from Ti, TiN or a layered film of these on the substrate surface including the inside of the contact holes, and thereafter a conductive metal film of W or the like is formed by the CVD method or such so as to fill up these contact holes, and then etch back is applied to these metal films to remove the conductive metal film and the barrier metal film lying in regions other than the inside of the contact holes. By this, a contact plug 18 to reach the gate electrode 9, and contact plugs 19–26 to reach source/drain regions are concurrently formed.

Next, a conductive film is formed from a TiN film or the like by the sputtering method or the CVD method, and patterning is applied to this conductive film with a photoresist used as a mask, whereby a local interconnection ($L_2$) 27 that is to be in contact with contact plugs 18, 19 and 20 is formed, as shown in FIG. 21. Thereat, the local interconnection ($L_2$) 27 is formed so that, seen from the top surface, a portion thereof overlaps, at least, a portion or the entire top surface of the lower layer local interconnection ($L_1$) (the inlaid interconnection 16), with the second interlayer insulating film 17 lying therebetween, and besides it is disposed to cover the exposed lateral face of the inlaid interconnection 16, with the second interlayer insulating film 17 lying therebetween.

As other embodiments of the present invention, structures capable to raise the capacitance of the capacitor element are described below.

Third Embodiment

Figure 23:
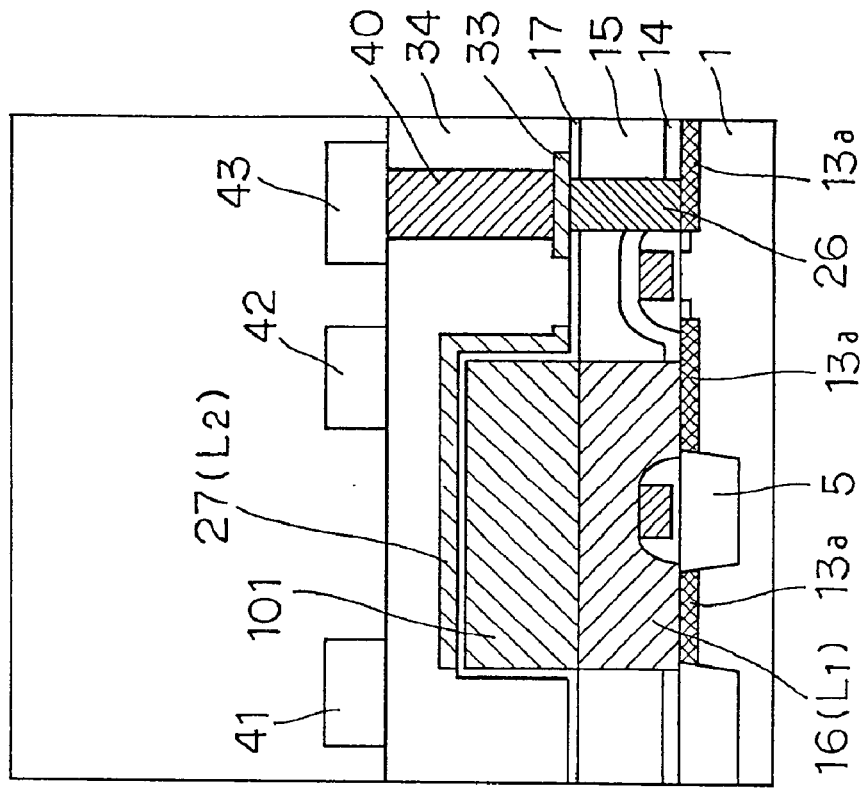
FIG. 23 is a cross-sectional view in explaining another embodiment of a SRAM memory cell in a semiconductor memory device according to the present invention.
Figure 23:
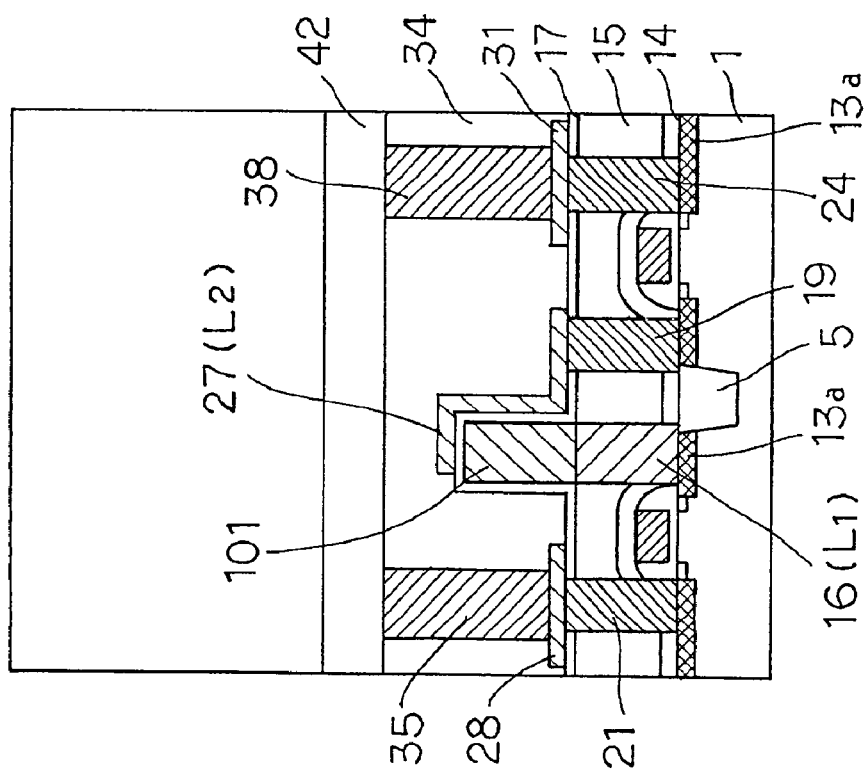

A cross-sectional view showing a structure of the present embodiment is presented in FIG. 23. FIGS. 23 (a) and (b) corresponds to FIG. 3(a) and (b) showing a structure of the First Embodiment, respectively.

In the structure of the present embodiment, a stacked electrode 101 is disposed on a lower layer local interconnection 16 ($L_1$) that is an inlaid interconnection. A plate-shaped upper layer local interconnection 27 ($L_2$) is disposed so as to cover, at least, a portion of the top surface as well as a portion of the lateral face of this stacked electrode 101 with an insulating film 17 lying therebetween. Although, in the drawing, the top surface and the lateral face of the stacked electrode 101 are partially covered, both of the faces can be entirely covered, as far as the margin permits. In such a structure, a capacitor element is formed also on the lateral face of the stacked electrode so that the capacitance of the element can be significantly raised.

The structure of the present embodiment can be formed as follows.

Figure 24:
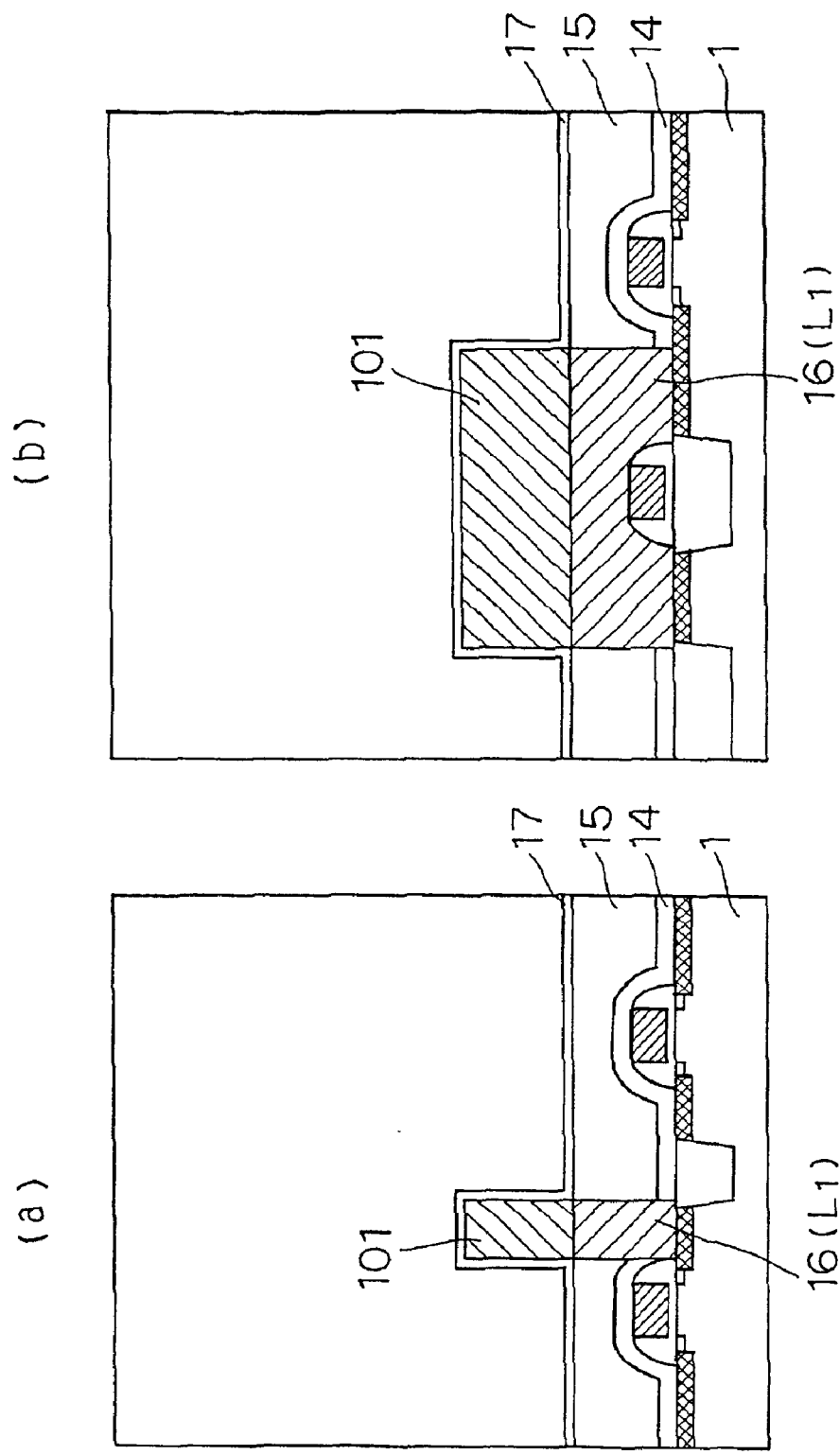
FIG. 24 is a cross-sectional view in explaining a manufacturing method of a SRAM memory cell in a semiconductor memory device according to the present invention.
Figure 25:
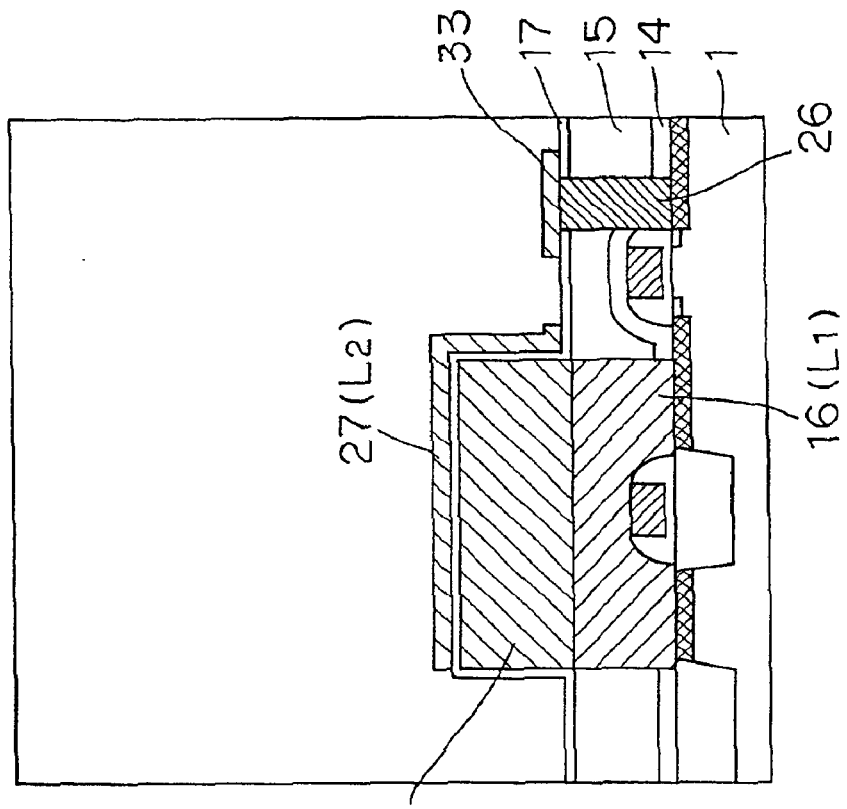
FIG. 25 is a cross-sectional view in explaining a manufacturing method of a SRAM memory cell in a semiconductor memory device according to the present invention.
Figure 25:
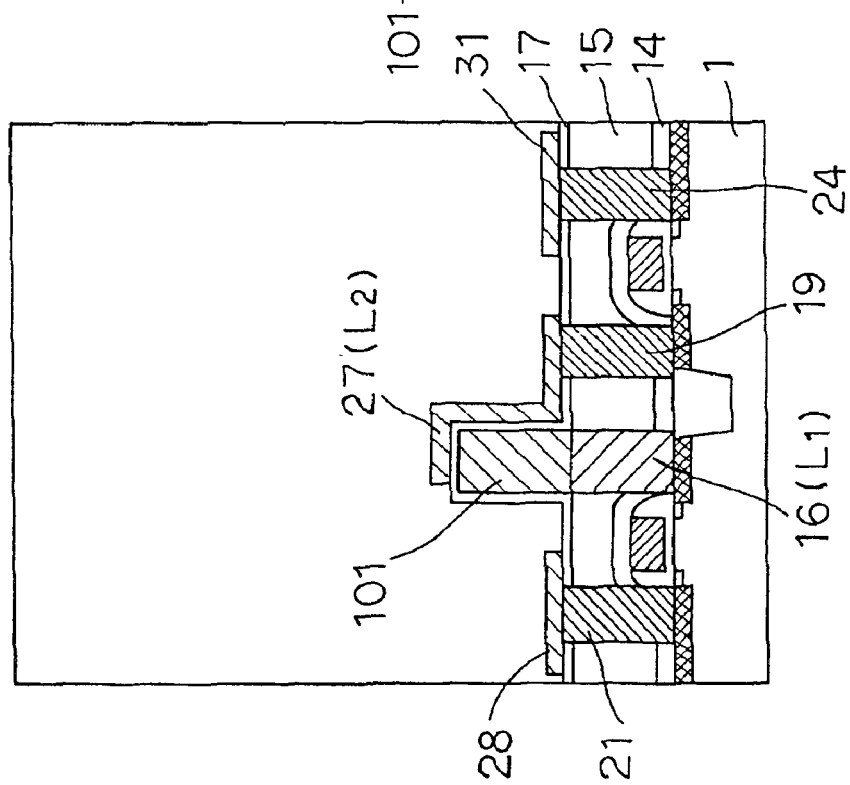
Figure 26:
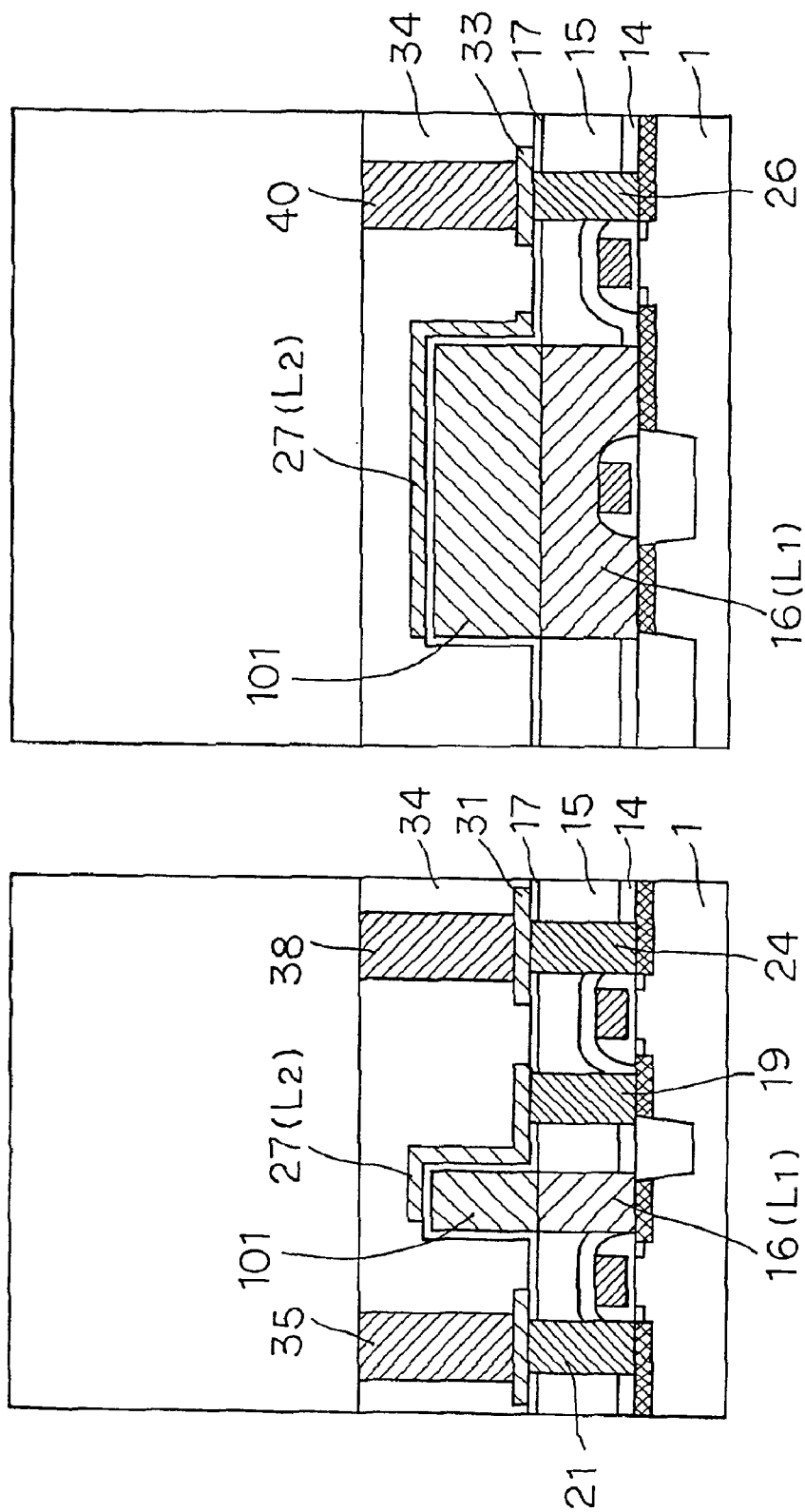
FIG. 26 is a cross-sectional view in explaining a manufacturing method of a SRAM memory cell in a semiconductor memory device according to the present invention.

After following the same steps as the First Embodiment, up to the one illustrated in FIG. 14, DOPOS (Doped Polycrystalline Silicon), DOPOS-HSG (Hemi-Spherical Grain), TiN or the like is grown, as shown in FIG. 24, and, by patterning the formed conductive film by means of known lithography, a stacked electrode 101 is formed on a lower layer local interconnection 16 ($L_1$). In this patterning, a mask having the same pattern as for the lower layer local interconnection 16 ($L_1$) can be utilized. On the other hand, it is also possible to dispose the lower layer local interconnection 16 ($L_1$) and stacked electrode 101 in such a way that, seen from the top with respect to the horizontal position, they may overlap partially with each other or one of them contain the other completely, as far as electrical conduction normally takes place and the margin permits. After the stacked electrode is formed in this way, a second interlayer insulating film 17 (a high-dielectric-constant film of $SiO_2$, SiN, TaO or such) that is to serve as a capacitor insulating film is formed. After this, a contact plug 18 to reach the gate electrode 9, and contact plugs 19–26 to reach source/drain regions are formed. Next, as shown in FIG. 25, a plate-shaped upper layer local interconnection 27 ($L_2$) is formed, and then a third interlayer insulating film 34 is formed to attain a structure shown in FIG. 26. Except that a stacked electrode 101 is set, and to cover this stacked electrode the upper layer local interconnection 27 ($L_2$) is set and, resulting from the stacked electrode being set, the third interlayer insulting film 34 is formed considerable thick, Third Embodiment can be fabricated in the same-way as First Embodiment.

Fourth Embodiment

Figure 27:
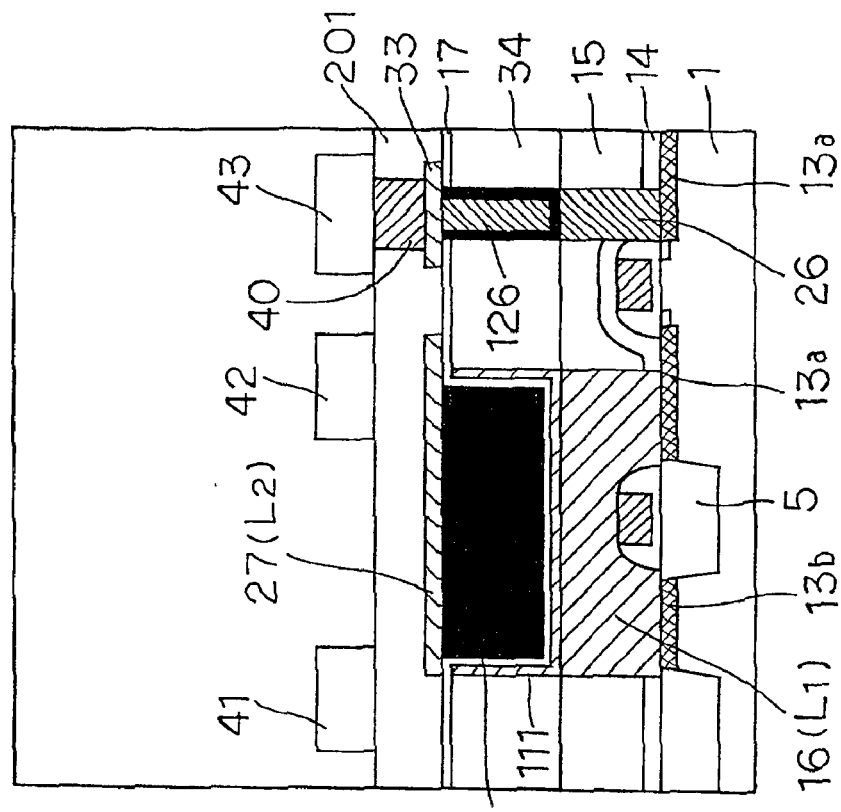
FIG. 27 is a cross-sectional view in explaining another embodiment of a SRAM memory cell in a semiconductor memory device according to the present invention.
Figure 27:
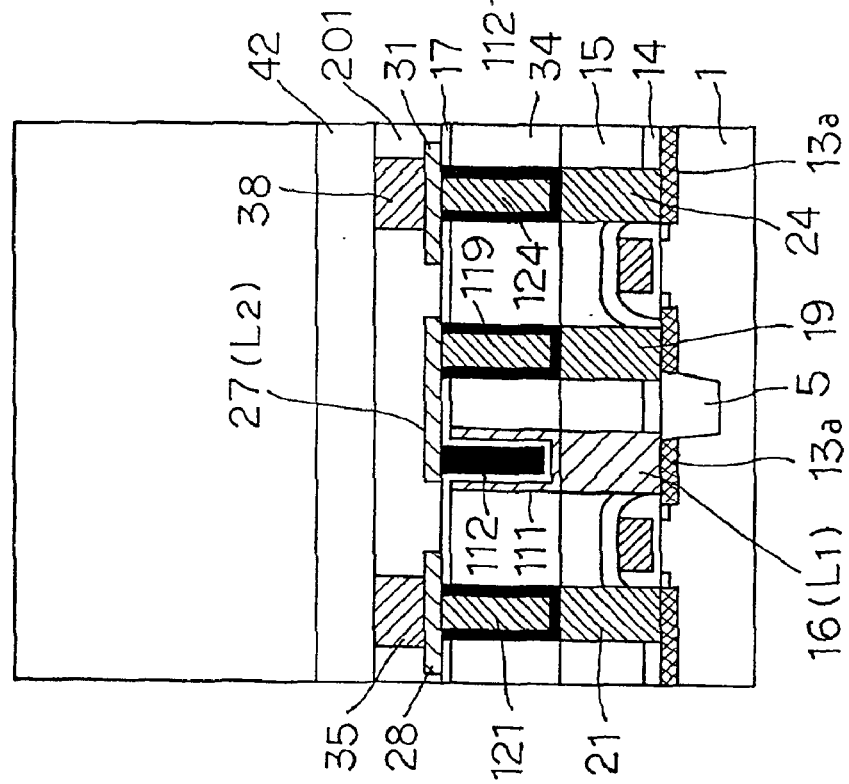

A cross-sectional view showing a structure of the present embodiment is presented in FIG. 27. FIGS. 27 (a) and (b) corresponds to FIG. 3(a) and (b) showing a structure of the First Embodiment, respectively.

In the structure of the present embodiment, a trench is set in a third interlayer insulating film 34 which is set, prior to an application of a second interlayer insulating film 17 that is to serve as a capacitor insulating film, and in this trench, there is formed a capacitor element composed of a cylinder electrode (an electrode film in trench, taking the shape of a hollow prism) 111 which covers the inside sidewall of the trench and besides the bottom of which comes into contact with the lower layer local interconnection 16 ($L_1$) and a buried electrode 112 which fills up the trench after a second interlayer insulating film 17 is applied thereto, and the second interlayer insulating film 17 placed therebetween. In such a structure, a capacitor element is formed also on the sidewall of the trench so that the capacitance of the element can be, significantly raised.

The structure of the present invention can be fabricated as follows.

Figure 28:
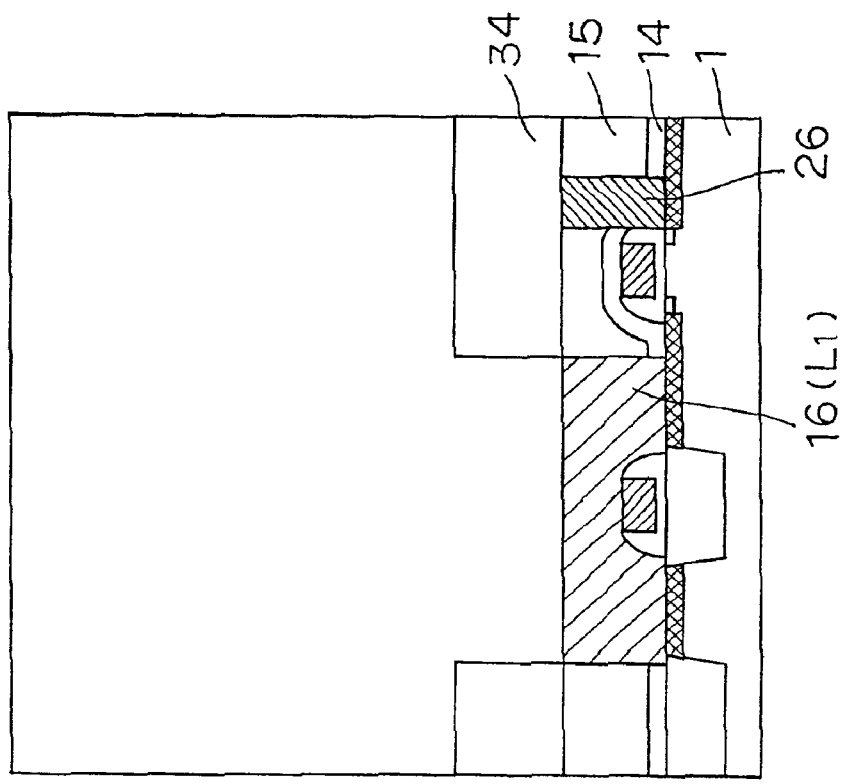
FIG. 28 is a cross-sectional view in explaining a manufacturing method of a SRAM memory cell in a semiconductor memory device according to the present invention.
Figure 28:
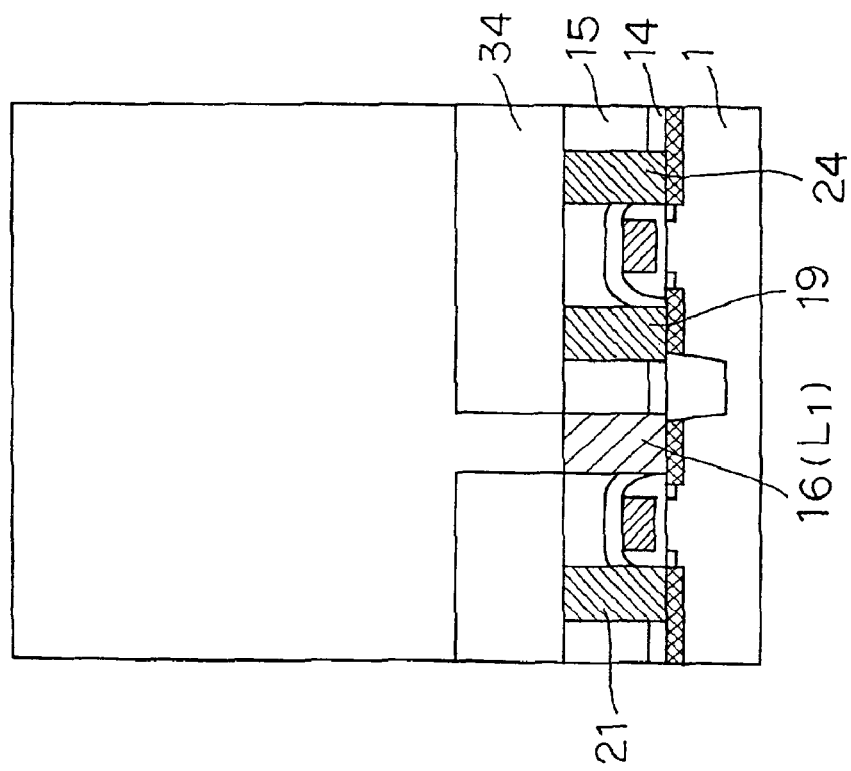
Figure 29:
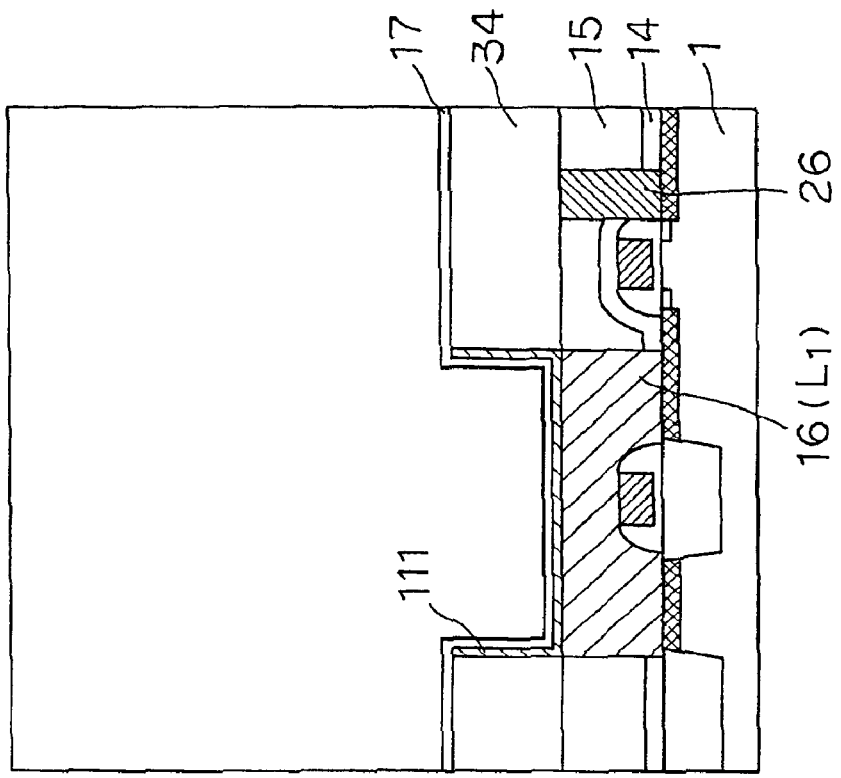
FIG. 29 is a cross-sectional view in explaining a manufacturing method of a SRAM memory cell in a semiconductor memory device according to the present invention.
Figure 29:
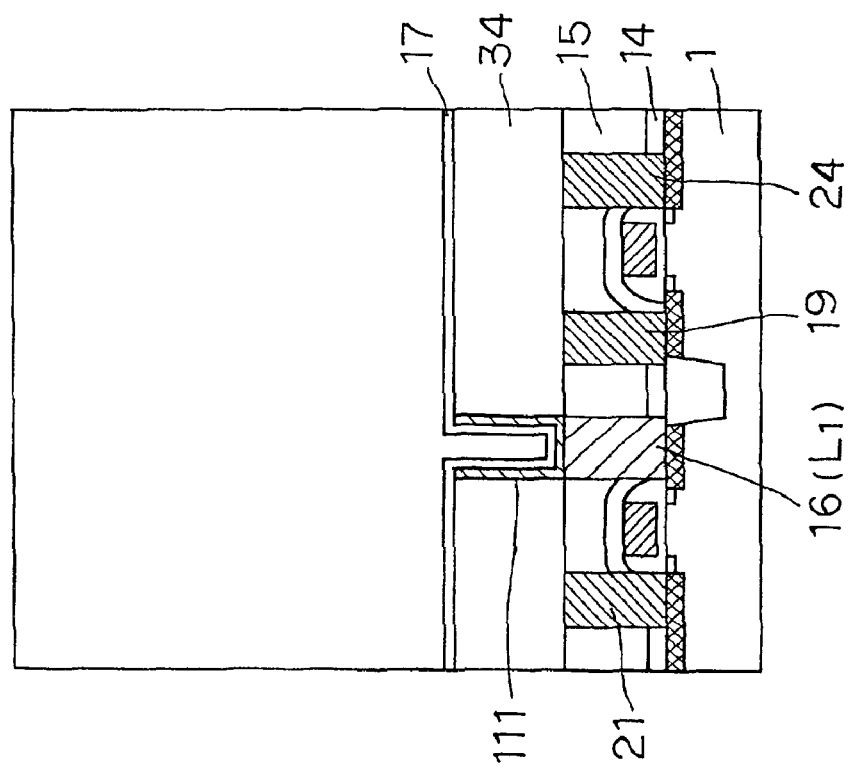
Figure 30:
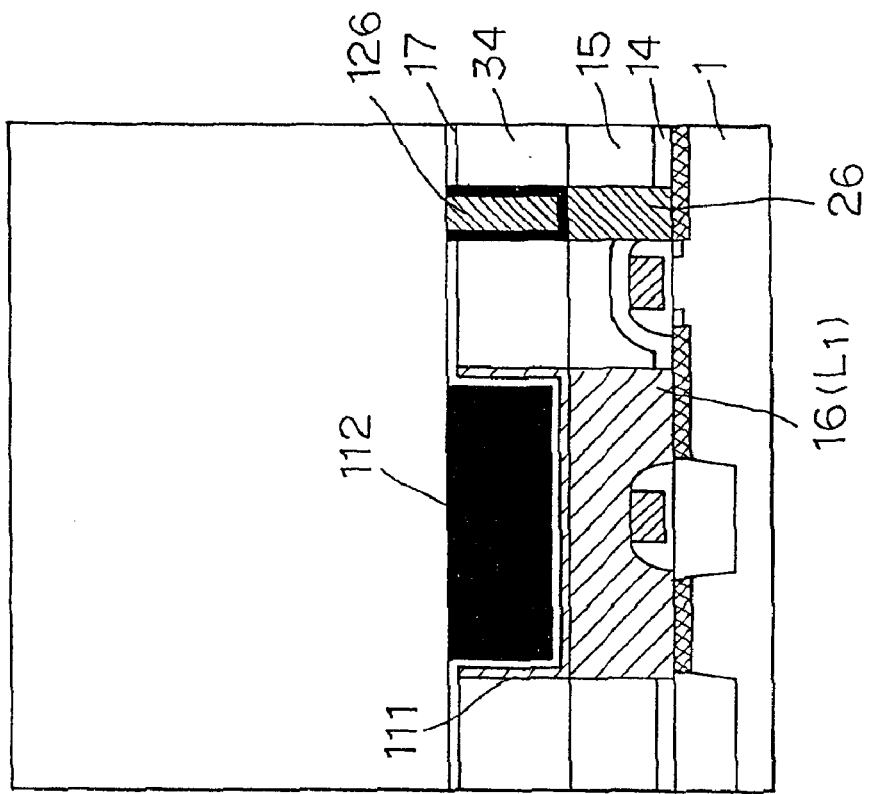
FIG. 30 is a cross-sectional view in explaining a manufacturing method of a SRAM memory cell in a semiconductor memory device according to the present invention.
Figure 30:
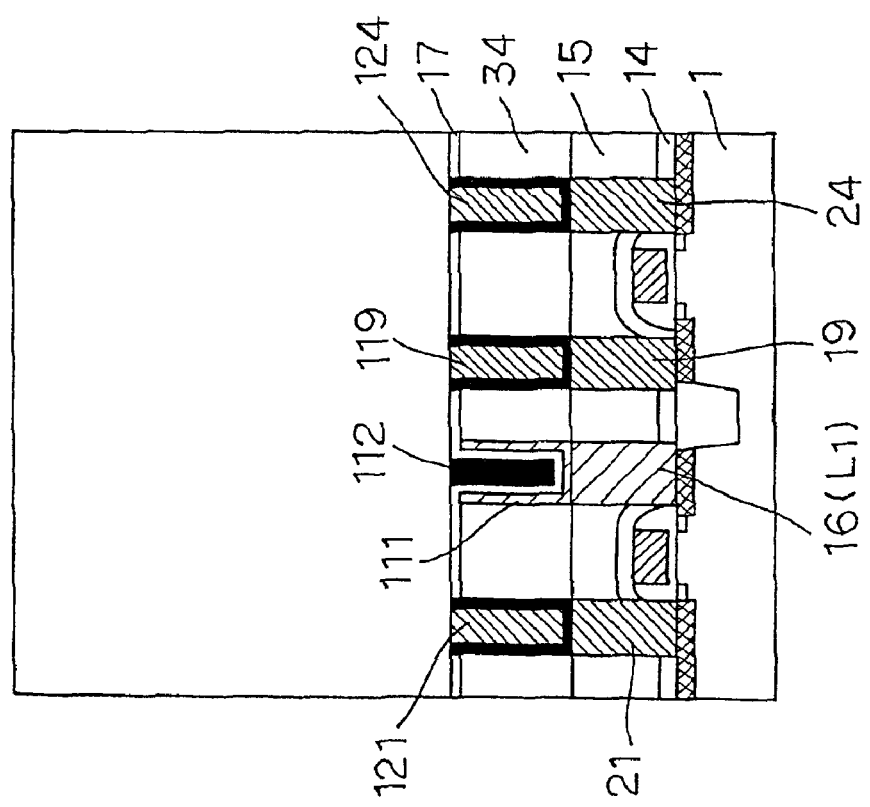
Figure 31:
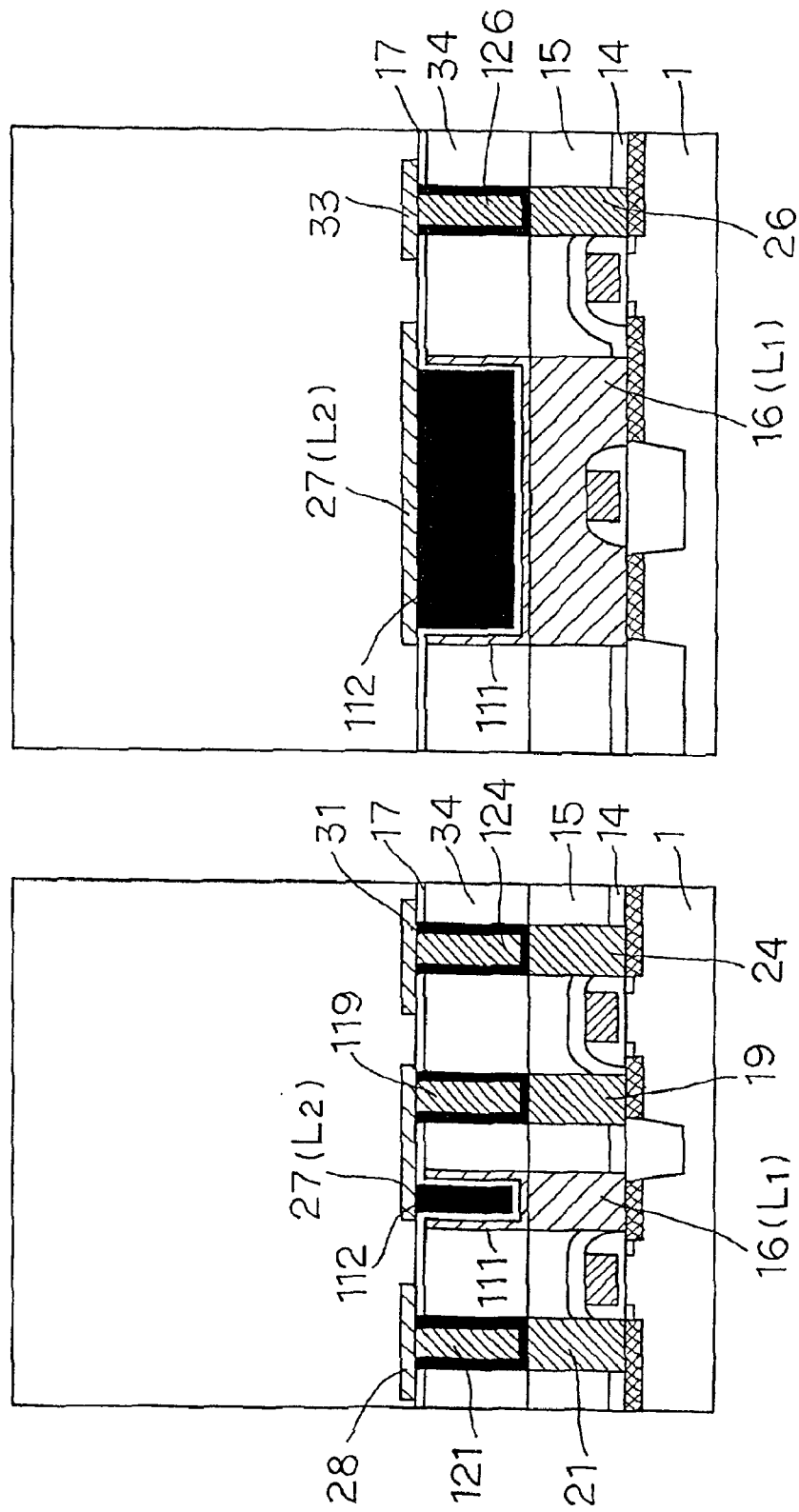
FIG. 31 is a cross-sectional view in explaining a manufacturing method of a SRAM memory cell in a semiconductor memory device according to the present invention.
Figure 32:
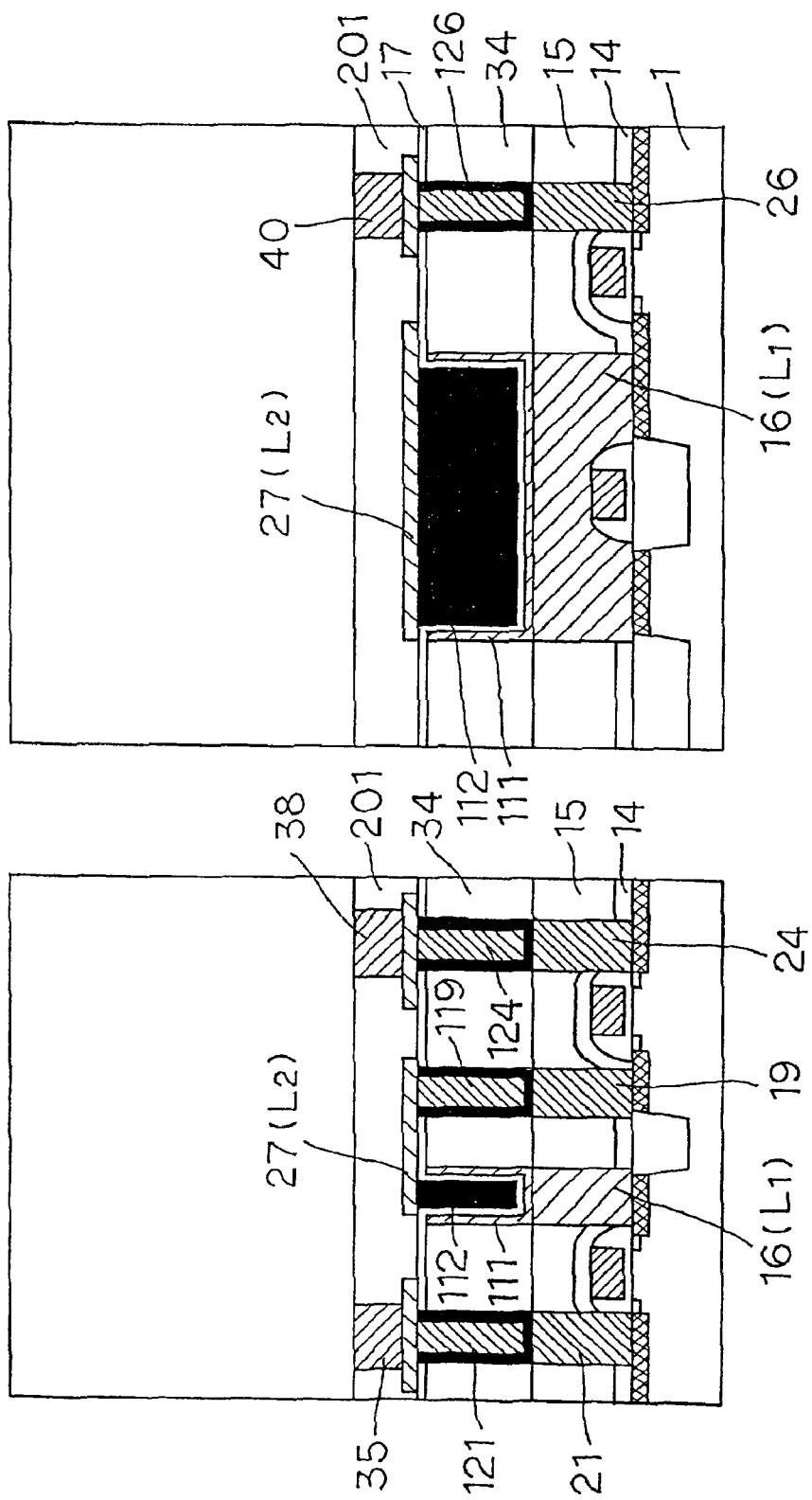
FIG. 32 is a cross-sectional view in explaining a manufacturing method of a SRAM memory cell in a semiconductor memory device according to the present invention.

After following the same steps as the First Embodiment, up to the one illustrated in FIG. 14, as shown in FIG. 28, a third interlayer insulating film 34 is set and, on a lower layer local interconnection 16 ($L_1$), a trench is formed so that, at least, part of the top surface of the lower layer local interconnection may be exposed. Next, after s conductive film of DOPOS, DOPOS-HSG, TiN or the like is grown and, coating of a resist is applied thereto and then etch back is applied to the resist film to remove the resist lying outside of the trench. Next, etch back is applied to the conductive film to remove the conductive film lying outside of the trench and then the resist present inside of the trench is removed. As a result, a cylinder electrode (an electrode film in trench) 111 is formed on the inside surface of the trench (FIG. 29). After that, a second interlayer insulating film 17 (a high-dielectric-constant film of $SiO_2$, SiN, TaO or such) that is to serve as a capacitor insulating film is formed. In forming the trench, a mask having the same pattern as for the lower layer local interconnection 16 ($L_1$) can be utilized. On the other hand, it is also possible to dispose the lower layer local interconnection 16 ($L_1$) and cylinder electrode 111 in such a way that, seen from the top with respect to the horizontal position, they may overlap partially with each other or one of them contain the other completely, as far as electrical conduction normally takes place and the margin permits. Next, in a third interlayer insulating film 34, there are formed via holes which reach contact plugs set in the first interlayer insulating film 15. Next, within these via holes, a barrier metal film (Ti, TiN or a layered film of TiN/Ti) is formed. Thereat, the inside of the trench may be filled up with the barrier metal (to form a buried electrode 112). When the trench is adequately large in width, the barrier metal film may be formed on the inside of the trench and thereafter the trench may be filled up with a conductive material such as W. Subsequently, via hole are filled up with a conductive material such as W and then etch back is applied thereto, whereby the structure shown in FIG. 30 is attained. Hereat, the barrier metal can be left on the substrate surface. Next, in the same way as in a manufacturing method of First Embodiment, a plate-shaped upper layer local interconnection 27 ($L_2$) is formed, as shown in FIG. 31, and thereafter, by forming a fifth interlayer insulating film 201, a structure shown in FIG. 32 is obtained. After that, in the same way as in a manufacturing method of First Embodiment, formation of a SRAM memory cell is accomplished.

Fifth Embodiment

Figure 33:
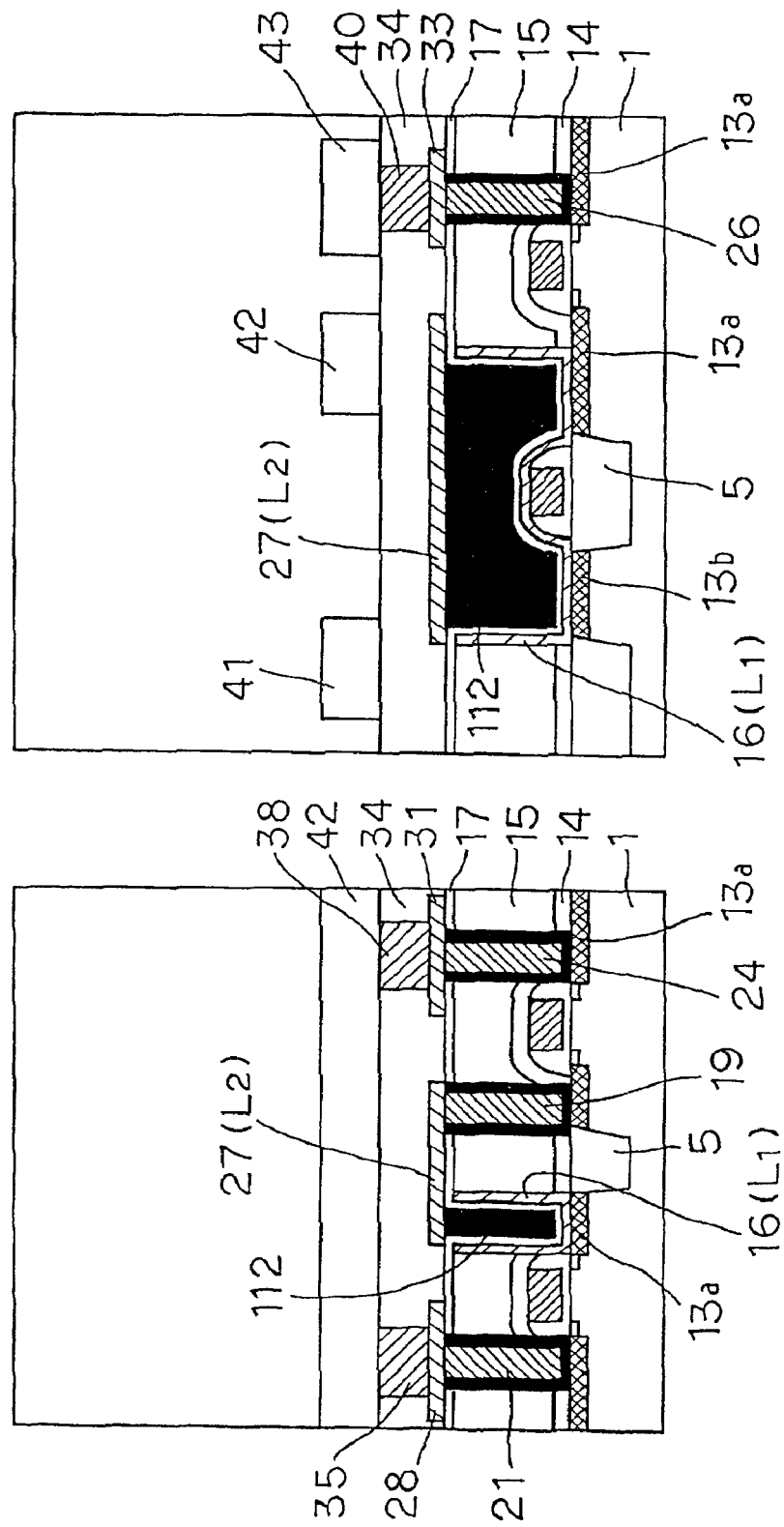
FIG. 33 is a cross-sectional view in explaining another embodiment of a SRAM memory cell in a semiconductor memory device according to the present invention.

A cross-sectional view showing a structure of the present embodiment is presented in FIG. 33. FIGS. 33 (a) and (b) corresponds to FIGS. 3(a) and (b) showing a structure of the First Embodiment, respectively.

In the structure of the present embodiment, a trench is set in a first interlayer insulating film 15, and in this trench, there is provided with a lower layer local interconnection 16 ($L_1$) in the shape of hollow prism which covers the inside sidewall of the trench. The bottom face (the contacting face with the substrate) of the cylindrical lower layer local interconnection 16 ($L_1$) is of the same shape and in the same disposition as the bottom face of the inlaid interconnection of First Embodiment which is the lower layer interconnection ($L_1$) of thereof. Further, in that trench, there is formed a capacitor element composed of the cylindrical lower layer local interconnection 16 ($L_1$), a buried electrode 112 which fills up the trench after a second interlayer insulating film 17 is applied thereto, and the second interlayer insulating film 17 placed therebetween. In such a structure, a capacitor element is formed also on the sidewall of the trench so that the capacitance of the element can be significantly raised.

The structure of the present embodiment can be fabricated as follows.

Figure 34:
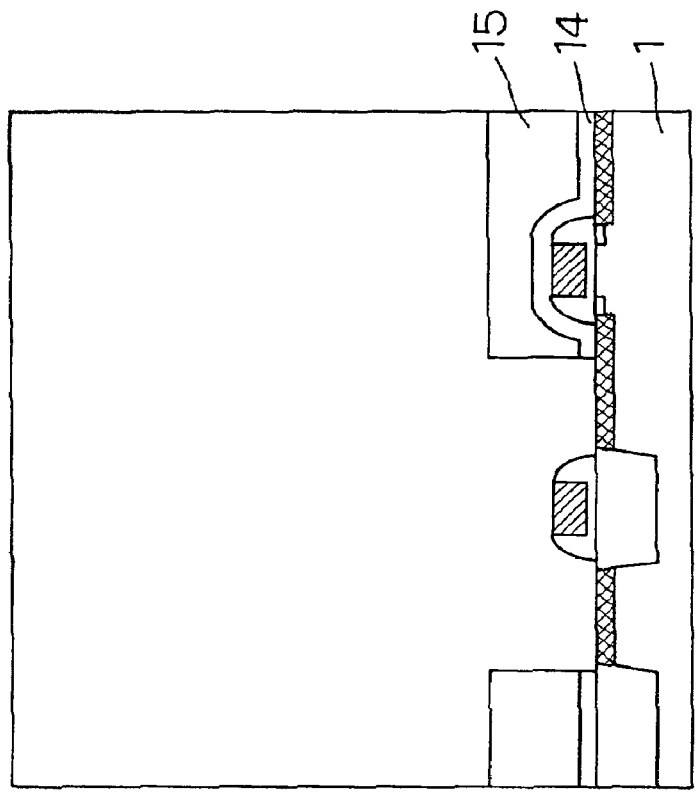
FIG. 34 is a cross-sectional view in explaining a manufacturing method of a SRAM memory cell in a semiconductor memory device according to the present invention.
Figure 34:
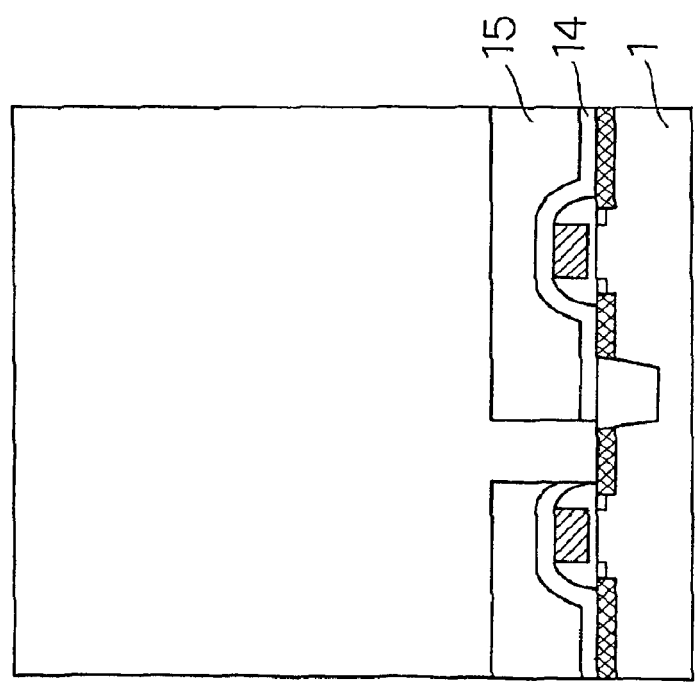
Figure 35:
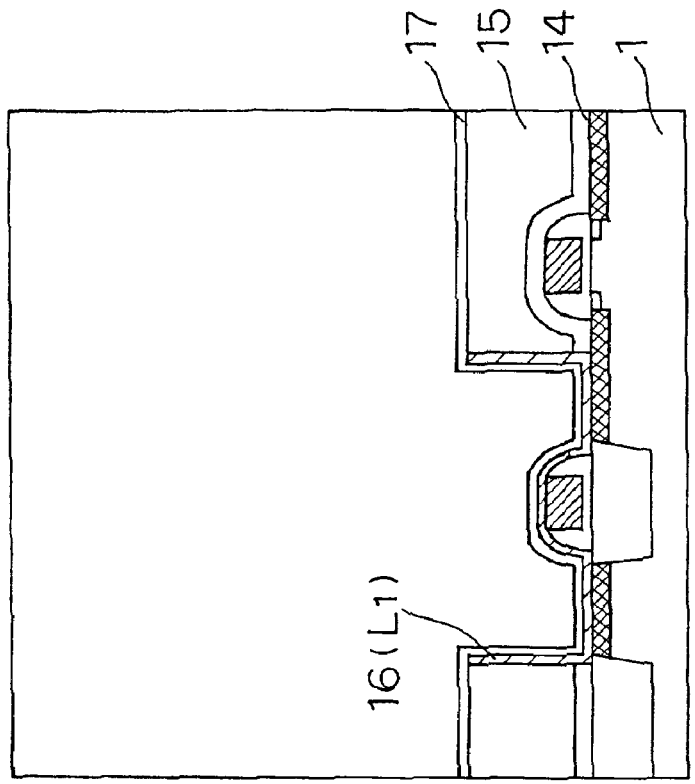
FIG. 35 is a cross-sectional view in explaining a manufacturing method of a SRAM memory cell in a semiconductor memory device according to the present invention.
Figure 35:
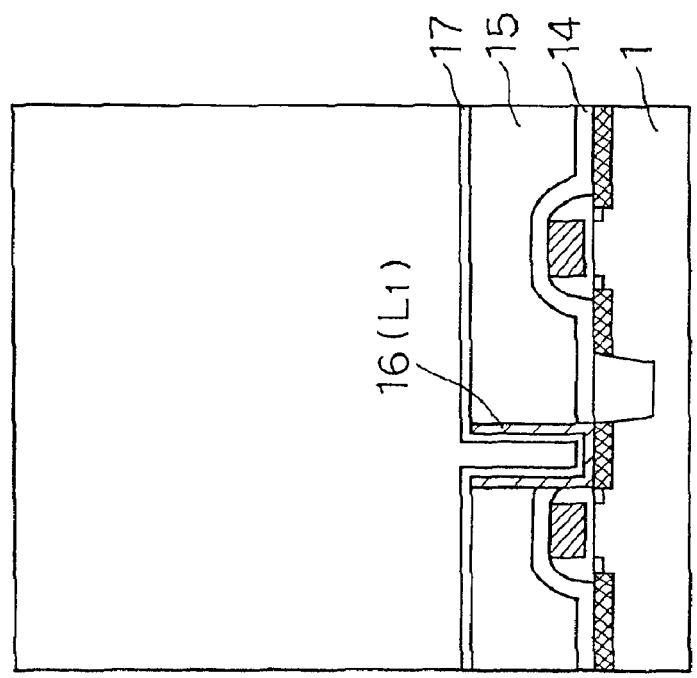
Figure 36:
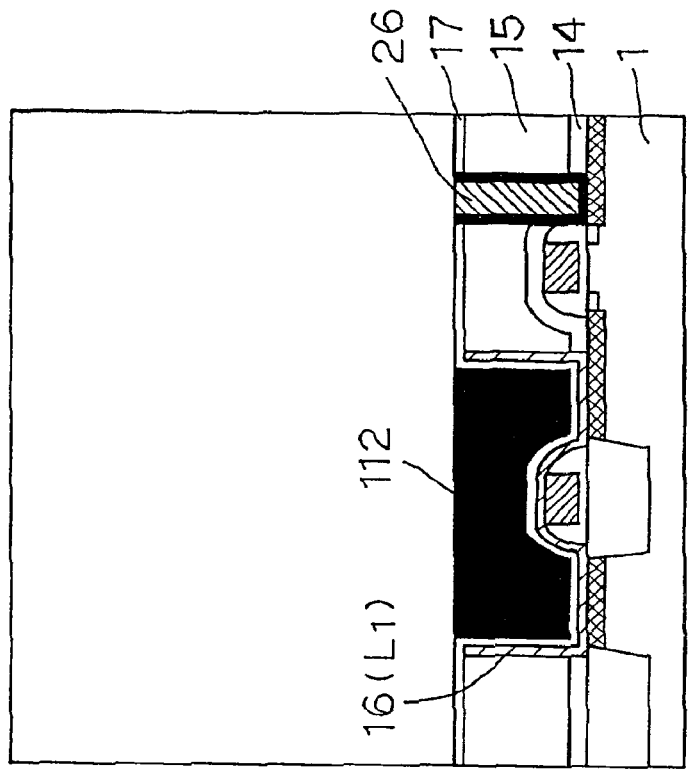
FIG. 36 is a cross-sectional view in explaining a manufacturing method of a SRAM memory cell in a semiconductor memory device according to the present invention.
Figure 36:
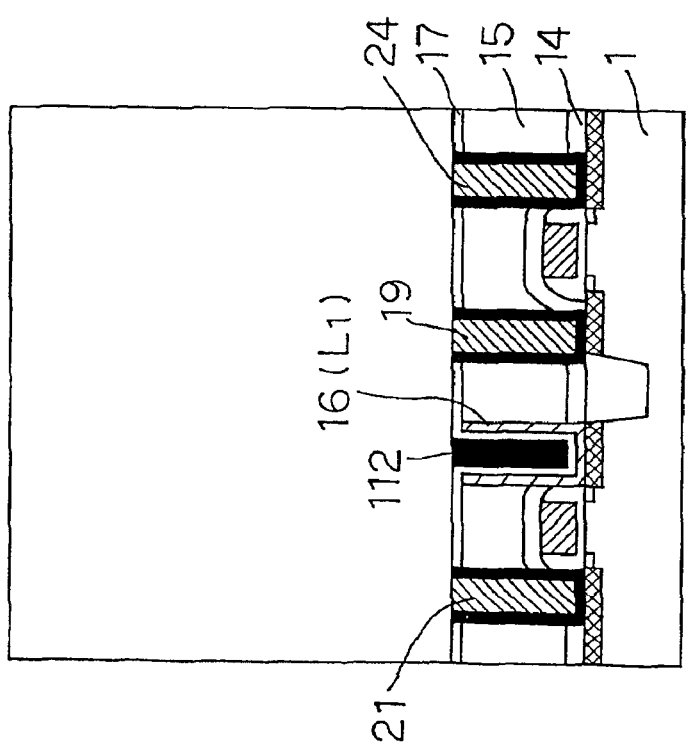
Figure 37:
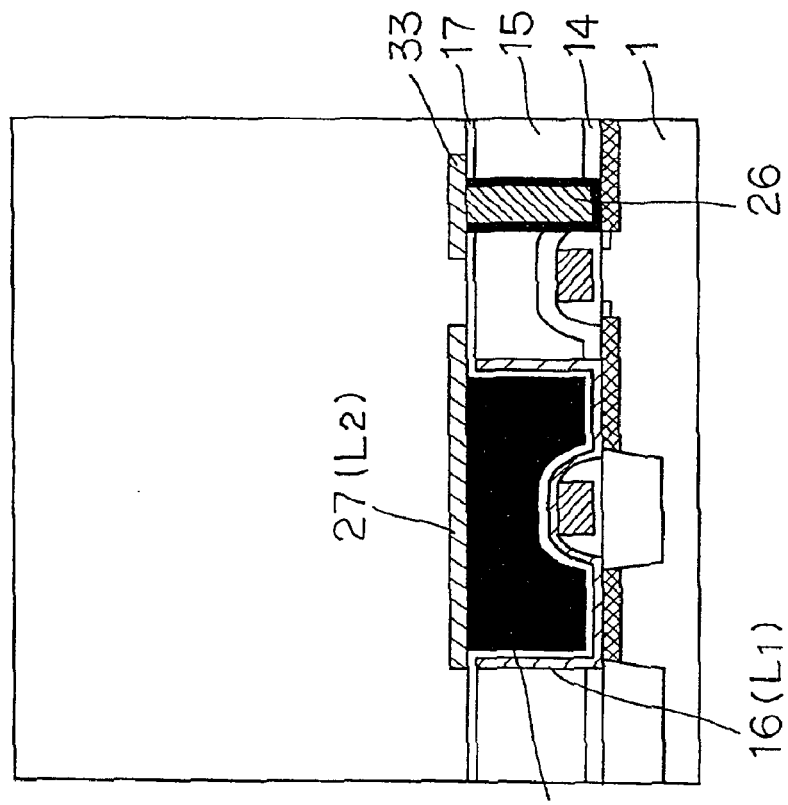
FIG. 37 is a cross-sectional view in explaining a manufacturing method of a SRAM memory cell in a semiconductor memory device according to the present invention.
Figure 37:
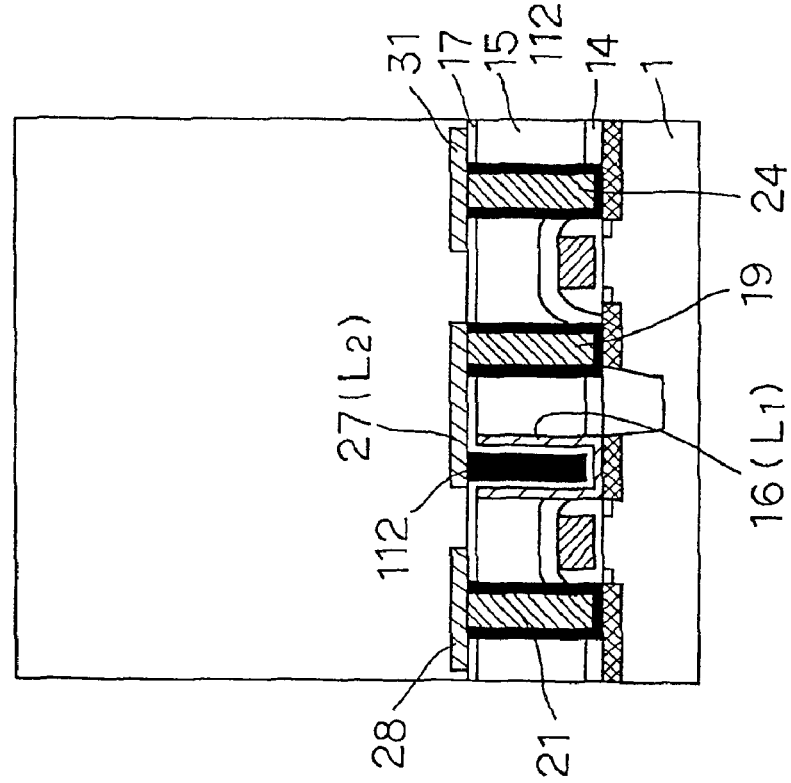
Figure 38:
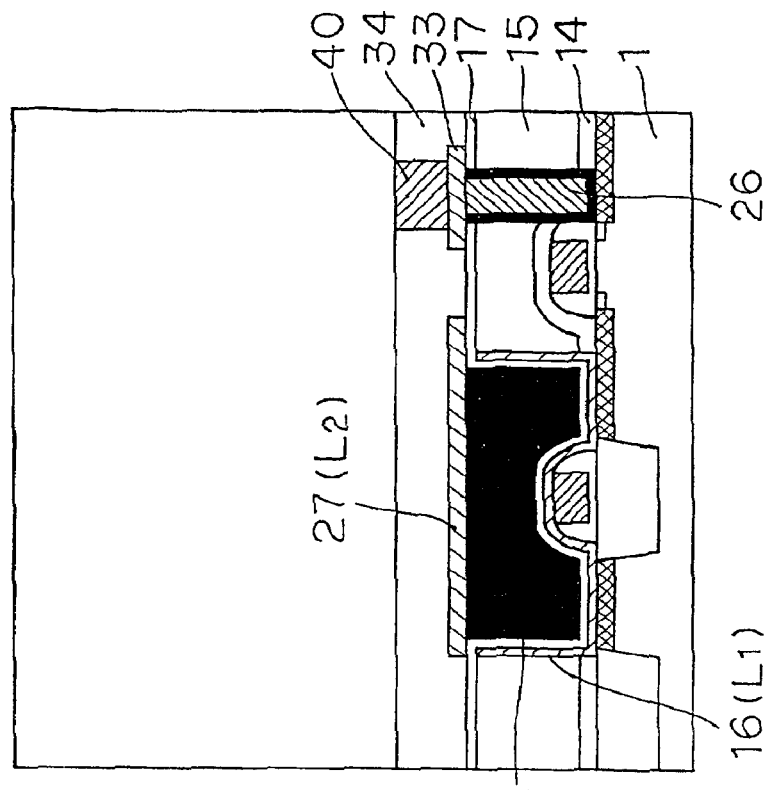
FIG. 38 is a cross-sectional view in explaining a manufacturing method of a SRAM memory cell in a semiconductor memory device according to the present invention.
Figure 38:
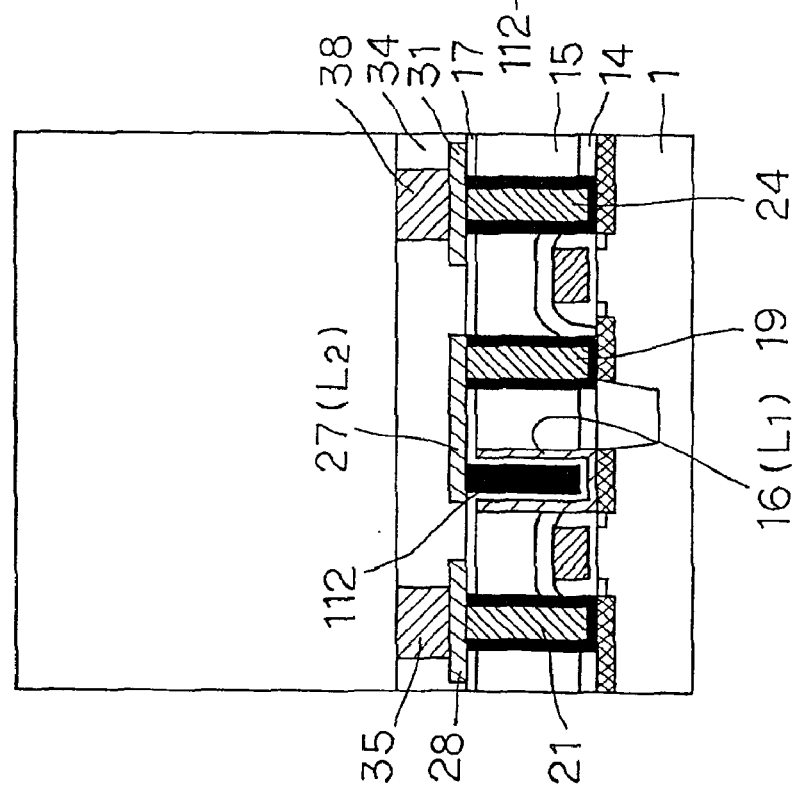

A structure shown in FIG. 34 is formed in the same way as First Embodiment, up to the step immediately before the step of filling up the trench with a conductive material, as illustrated in FIG. 14. Next, after s conductive film of DOPOS, DOPOS-HSG, TiN or the like is grown and, coating of a resist is applied thereto and then etch back is applied to the resist film to remove the resist lying outside of the trench. Next, etch back is applied to the conductive film to remove the conductive film lying outside of the trench and then the resist present inside of the trench is removed. As a result, a lower layer local interconnection 16 ($L_1$) in the shape of a hollow prism is formed on the inside surface of the trench (FIG. 35). After that, a second interlayer insulating film 17 (a high-dielectric-constant film of $SiO_2$, SiN, TaO or such) that is to serve as a capacitor insulating film is formed. Next, prescribed contact holes are formed in the first interlayer insulating film 15 and, within these contact holes, a barrier metal film (Ti, TiN or a layered film of TiN/Ti) is formed. Thereat, the inside of the trench may be filled up with the barrier metal (to form a buried electrode 112). When the trench is adequately large in width, the barrier metal film may be formed on the inside of the trench and thereafter the trench may be filled up with a conductive material such as W. Subsequently, contact holes are filled up with a conductive material such as W and then etch back is applied thereto, whereby the structure shown in FIG. 36 is attained. Hereat, the barrier metal can be left on the substrate surface. Next, in the same way as in a manufacturing method of First Embodiment, a plate-shaped upper layer local interconnection 27 ($L_2$) is formed, as shown in FIG. 37, and thereafter, by forming a third interlayer insulating film 34, a structure shown in FIG. 38 is obtained. After that, in the same way as in a manufacturing method of First Embodiment, formation of a SRAM memory cell is accomplished.

What is claimed is:

1. A Static Random Access Memory (SRAM) cell, comprising:
    a first diffusion region formed on a semiconductor substrate;
    a second diffusion region formed on said semiconductor substrate;
    a first conductive layer formed over said semiconductor substrate;
    an interlayer insulating film formed on said semiconductor substrate, said interlayer insulating film having an opening which exposes said first and second diffusion regions and said first conductive layer;
    a second conductive layer formed in said opening and contacting said first and second diffusion regions;
    a dielectric layer formed on said second conductive layer; and
    a third conductive layer formed on said dielectric layer, whereby a capacitor is formed by said second and third conductive layers and said dielectric layer.

2. The SRAM cell as claimed in claim 1, said cell further comprising:
    a first load transistor which has source and drain regions, one of which corresponds to said first diffusion region; and
    a first drive transistor which has source and drain regions, one of which corresponds to said second diffusion region.

3. The SRAM cell as claimed in claim 1, wherein a top surface of said second conductive layer is lower than that of said interlayer insulating film.

4. The SRAM cell as claimed in claim 1, wherein said first conductive layer is formed on an element isolation layer on said semiconductor substrate.

5. The SRAM cell as claimed in claim 1, wherein said opening is filled with said second conductive layer.

6. The SRAM cell as claimed in claim 1, wherein said opening is filled with said third conductive layer.

7. The SRAM cell as claimed in claim 1, further comprising:
    an element isolation layer formed between said first and second diffusion regions; and
    a first region formed over said element isolation layer in the opening to define a space as the rest portion in the opening, wherein
    said space is filled with the second conductive layer.

8. The SRAM cell as claimed in claim 1, further comprising:
    an element isolation layer formed between said first and second diffusion regions; and
    a first region formed over said element isolation layer in the opening to define a space as the rest portion in the opening, wherein
    said space is filled with the third conductive layer.

9. The SRAM cell as claimed in claim 1, wherein
    said second conductive layer is made of metal and
    said third conductive layer is made of metal.

10. A Static Random Access Memory (SRAM) cell, comprising:
    a first diffusion region formed on a semiconductor substrate;
    a second diffusion region formed on said semiconductor substrate;
    a first conductive layer formed over said semiconductor substrate;
    an interlayer insulating film formed on said semiconductor substrate, said interlayer insulating film having an opening which exposes said first and second diffusion regions and said first conductive layer;
    a second conductive layer formed in said opening;
    a dielectric layer farmed on said second conductive layer;
    a third conductive layer formed on said dielectric layer, whereby a capacitor is formed by said second and third conductive layers and said dielectric layer;
    a first load transistor which has source and drain regions, one of which corresponds to said first diffusion region;
    a first drive transistor which has source and drain regions, one of which corresponds to said second diffusion region;
    a second load transistor and a second drive transistor, each of said second load transistor and said second drive transistor having a gate electrode;
    wherein said first conductive layer has a "T" shape having two branches, one of said branches corresponding to said second load transistor and the other of said branches corresponding to said second drive transistor.

11. The SRAM cell as claimed in claim 10, wherein a first contact is connected between said third conductive layer and a gate electrode of said first load transistor and of said first drive transistor, a second contact is connected between said third conductive layer and said second load transistor, and a third contact is connected between said third conductive layer and said second drive transistor.

12. The SRAM cell as claimed in claim 11, wherein said gate electrode, said branches and said second conductive layer are arranged in parallel with one another.

13. The SRAM cell as claimed in claim 10, wherein
said first conductive layer has a trunk of the "T" shape, and
a bottom of said trunk directly contacts the second conductive layer.

14. A Static Random Access Memory (SRAM) cell, comprising:
a first diffusion region formed on a semiconductor substrate;
a second diffusion region formed on said semiconductor substrate;
a first conductive layer formed over said semiconductor substrate;
an interlayer insulating film formed on said semiconductor substrate, said interlayer insulating film having an opening which exposes said first and second diffusion regions and said first conductive layer;
a second conductive layer formed in said opening;
a dielectric layer formed on said second conductive layer; and
a third conductive layer formed on said dielectric layer, whereby a capacitor is formed by said second and third conductive layers and said dielectric layer, wherein a top surface of said second conductive layer is higher than that of said interlayer insulating film.

15. The SRAM cell as claimed in claim 14, wherein said dielectric layer is formed on facing side surfaces of said second conductive layer.

16. The SRAM cell as claimed in claim 15, wherein said dielectric layer is formed on a single side of said facing side surfaces of said second conductive layer.

* * * * *